(12) United States Patent
Sheng

(10) Patent No.: US 11,131,508 B2
(45) Date of Patent: Sep. 28, 2021

(54) MIDDLE MEMBER OF HEAT DISSIPATION DEVICE AND THE HEAT DISSIPATION DEVICE

(71) Applicant: ASIA VITAL COMPONENTS CO., LTD., New Taipei (TW)

(72) Inventor: Wei-Kong Sheng, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 112 days.

(21) Appl. No.: 16/150,285

(22) Filed: Oct. 3, 2018

(65) Prior Publication Data
US 2019/0285353 A1    Sep. 19, 2019

Related U.S. Application Data

(63) Continuation-in-part of application No. 15/925,704, filed on Mar. 19, 2018, now abandoned.

(51) Int. Cl.
| | | |
|---|---|---|
| *F28D 15/02* | (2006.01) | |
| *F28F 3/12* | (2006.01) | |
| *F28D 15/04* | (2006.01) | |
| *F28F 21/08* | (2006.01) | |

(52) U.S. Cl.
CPC .......... *F28D 15/02* (2013.01); *F28D 15/046* (2013.01); *F28F 3/12* (2013.01); *F28F 21/081* (2013.01)

(58) Field of Classification Search
CPC .... F28D 15/02; F28D 15/0233; F28D 15/046; F28F 3/12; F28F 21/081; H01L 23/427; H05K 7/20366
See application file for complete search history.

(56) References Cited

U.S. PATENT DOCUMENTS

| | | | | |
|---|---|---|---|---|
| 6,397,935 | B1 * | 6/2002 | Yamamoto | .......... F28D 15/0233 165/104.21 |
| 7,770,631 | B2 * | 8/2010 | Wang | .................. F28D 15/0233 165/104.26 |

(Continued)

FOREIGN PATENT DOCUMENTS

| | | |
|---|---|---|
| CN | 201229543 Y | 4/2009 |
| CN | 101893401 A | 11/2010 |

(Continued)

*Primary Examiner* — Eric S Ruppert
*Assistant Examiner* — Hans R Weiland
(74) *Attorney, Agent, or Firm* — Thomas J. Nikolai; DeWitt LLP

(57) ABSTRACT

A middle member of heat dissipation device and the heat dissipation device. The middle member includes a middle member main body having a first face, a second face, multiple perforations and a channeled structure assembly. The channeled structure assembly is disposed on the first face or the second face. The perforations are formed through the middle member main body between the first and second faces. The channeled structure assembly and the perforations are arranged in alignment with each other or not in alignment with each other. The middle member and a first plate body and a second plate body are overlapped with each other to form the heat dissipation device. The complex structures disposed on the first and second faces of the middle member main body are able to achieve a stable vapor-liquid circulation effect.

38 Claims, 28 Drawing Sheets

(56) References Cited

U.S. PATENT DOCUMENTS

| | | | |
|---|---|---|---|
| 8,377,214 B2* | 2/2013 | Zhang | F28D 15/046 118/733 |
| 2002/0020518 A1* | 2/2002 | Li | F28D 15/0233 165/104.11 |
| 2003/0024691 A1* | 2/2003 | Tsay | F28D 15/0233 165/104.26 |
| 2007/0107875 A1* | 5/2007 | Lee | H01L 23/427 165/104.26 |
| 2007/0240857 A1* | 10/2007 | Hou | F28D 15/046 165/104.26 |
| 2007/0240860 A1 | 10/2007 | Meyer, IV, et al. | |
| 2010/0108296 A1* | 5/2010 | Moon | F28D 15/04 165/104.26 |
| 2010/0139894 A1* | 6/2010 | Zhou | F28D 15/046 165/104.26 |
| 2010/0157535 A1* | 6/2010 | Oniki | H05K 7/20336 361/700 |
| 2010/0294475 A1* | 11/2010 | Rush | F28D 15/046 165/185 |
| 2011/0011565 A1* | 1/2011 | Hou | F28D 15/06 165/104.26 |
| 2011/0168359 A1* | 7/2011 | Lin | F28D 15/0233 165/104.26 |
| 2012/0031587 A1* | 2/2012 | Huang | F28D 15/046 165/104.26 |
| 2012/0145357 A1* | 6/2012 | Moon | F28D 15/046 165/104.26 |

FOREIGN PATENT DOCUMENTS

| | | |
|---|---|---|
| CN | 101520286 B | 5/2011 |
| CN | 102189680 A | 9/2011 |
| CN | 103124490 A | 5/2013 |
| CN | 203132406 U | 8/2013 |
| CN | 103185476 B | 5/2016 |
| CN | 206073779 U | 4/2017 |
| CN | 106679473 A | 5/2017 |
| TW | 200936977 A | 9/2009 |
| TW | M399977 U1 | 3/2011 |
| TW | 201231903 A1 | 8/2012 |
| TW | I582367 B | 5/2017 |

* cited by examiner

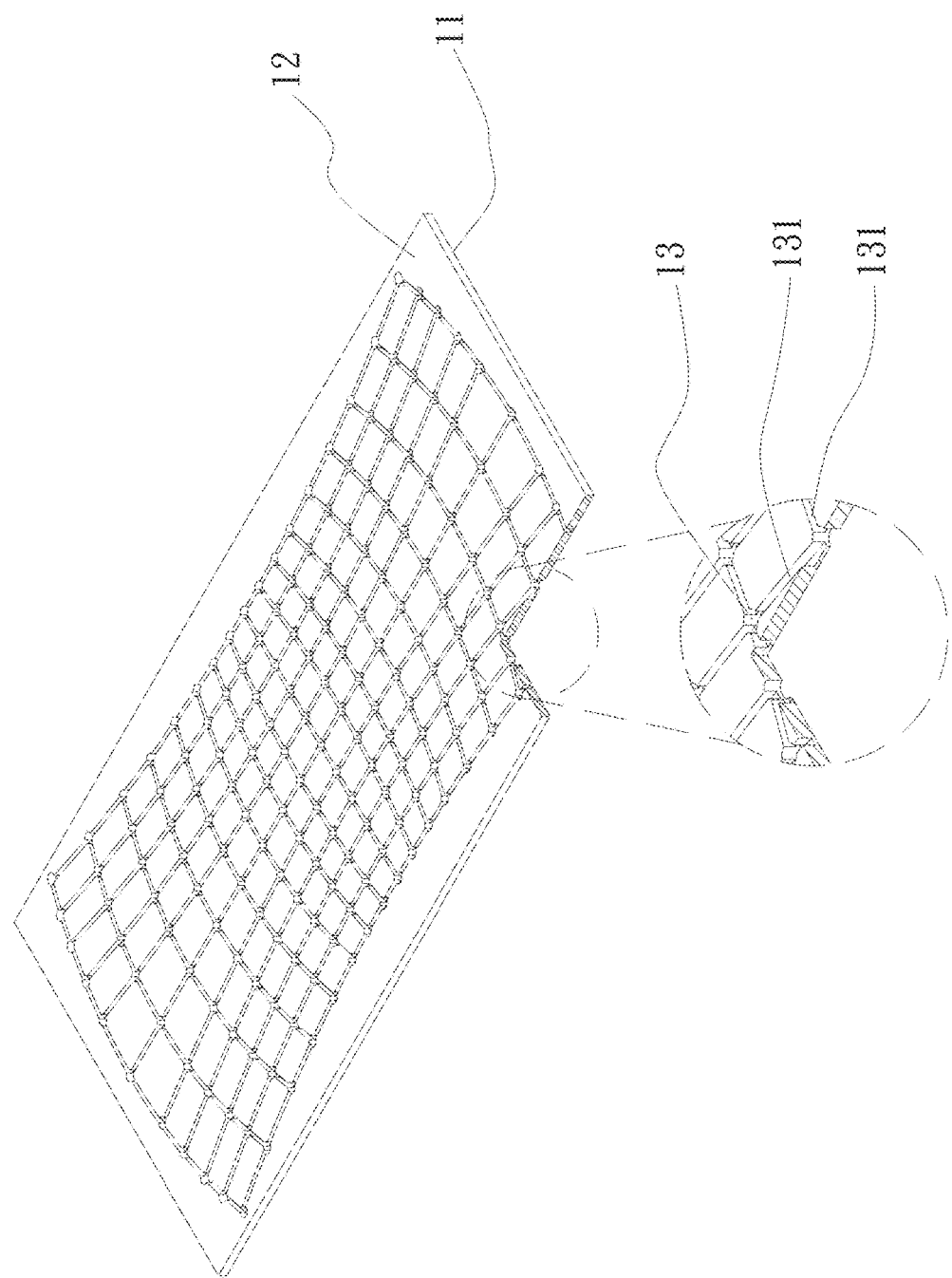

MIDDLE MEMBER OF HEAT DISSIPATION DEVICE AND THE HEAT DISSIPATION DEVICE

The present application is a continuation in part of U.S. patent application Ser. No. 15/925,704, filed on Mar. 19, 2018.

BACKGROUND OF THE INVENTION

1. Field of the Invention

The present invention relates generally to a middle member of heat dissipation device and the heat dissipation device, and more particularly to a middle member of heat dissipation device and the heat dissipation device, which includes one single plate of middle member main body having a first face and a second face. Complex surface structures are disposed on one of the first and second faces or both the first and second faces of the middle member main body to enhance the capillary attraction.

2. Description of the Related Art

Currently, there are various heat dissipation devices. Some of the heat dissipation devices transfer and dissipate heat by way of vapor-liquid circulation, such as heat pipe and vapor chamber. When applied to a device with a narrow space, such as a mobile phone or an intelligent watch, the entire structures of the heat pipe and the vapor chamber must be thinned in adaptation to the narrow space of the device.

Either of the heat pipe and the vapor chamber has an internal vacuumed chamber. A capillary structure is disposed in the vacuumed chamber and a working fluid is contained in the vacuumed chamber. When heated, the liquid working fluid in the vacuumed chamber is evaporated into vapor. The vapor working fluid is then condensed into liquid working fluid. Accordingly, the working fluid is changed between vapor phase and liquid phase to transfer the heat. Therefore, the vapor passage for the evaporated working fluid to diffuse and the capillary structure for the condensed working fluid to flow back are critical in the design of the thinned heat pipe and vapor chamber. However, when thinning the heat pipe and vapor chamber, the space of the vacuumed chamber will be inevitably narrowed. Also, the structural strength of the capillary structure and the external plate bodies will be affected. All these issues have become the most important problems needing to be solved.

The vapor chamber and heat pipe are most often made of copper material. Copper has the properties of fast heat conduction and high ductility and malleability. Therefore, a thinned copper plate or copper tube is apt to deform. After deformed, the vacuumed chamber of the vapor chamber and heat pipe is compressed, narrowed or collapsed. As a result, the working fluid filled in the vacuumed chamber will be impossible to perform vapor-liquid circulation work to transfer the heat.

Moreover, after thinned, the space of the vacuumed chamber is minified. Under such circumstance, it is a critical issue how to select a capillary structure disposed in the vacuumed chamber. It is harder for the sintered powder to dispose in the narrow space. Therefore, some manufacturers select thin mesh body as the capillary structure instead of the sintered powder. However, it is still necessary to sinter the thin mesh body with the wall of the external plate body or tube body so as to prevent the mesh body from warping or sliding within the chamber. In the narrow vacuumed chamber, it is quite hard to sinter the capillary structure with the wall of the chamber. Moreover, after sintered, it often takes place that the vapor passage is blocked.

Furthermore, after compressed and deformed, the conventional capillary structure disposed in the narrow space, such as sintered powder or woven mesh body will fail to effectively control the flow distribution of the liquid in three-dimensional directions (axial direction and radial direction). Also, the vapor cannot leave the capillary structure. As a result, the resistance against the vapor and the liquid cannot be reduced. This will interrupt the vapor-liquid circulation and the heat of the heat source in contact with the vapor chamber or heat pipe cannot be successfully conducted and dissipated to cause heat crash or burnout of the chip. In addition, the conventional capillary structure such as the sintered powder or woven mesh body cannot set up a vapor-liquid separation heat flow structure. In the vapor chamber, the flow direction of the vapor is reverse to the flow direction of the liquid so that a splash phenomenon between the vapor and the liquid often takes place to increase the resistance against the vapor and the liquid.

It is therefore tried by the applicant to provide a middle member of heat dissipation device and the heat dissipation device to solve the above problems existing in the conventional thinned heat dissipation device.

SUMMARY OF THE INVENTION

It is therefore a primary object of the present invention to provide a middle member of heat dissipation device, which has a thin capillary structure with better capillary attraction.

The middle member includes a middle member main body having a first face, a second face, multiple perforations and a channeled structure. The channeled structure is disposed on the first face or the second face. The perforations are formed through the middle member main body between the first and second faces. The channeled structure and the perforations are arranged in alignment with each other or not in alignment with each other.

It is a further object of the present invention to provide a heat dissipation device including a middle member, a first plate body and a second plate body.

The middle member includes a middle member main body having a first face, a second face, multiple perforations and a channeled structure. The channeled structure is disposed on the first face or the second face. The perforations are formed through the middle member main body between the first and second faces. The channeled structure and the perforations are arranged in alignment with each other or not in alignment with each other.

The first plate body has a first surface and a second surface. The second plate body has a third surface and a fourth surface. The first and third surfaces are correspondingly mated with each other to together define a closed chamber. The middle member main body is disposed in the closed chamber and a working fluid is filled in the closed chamber.

According to the above arrangement, one single thin sheet of middle member main body is disposed between the first and second plate bodies. The channeled structure is disposed on one face or both faces of the middle member main body. The channeled structure and the perforations are arranged in alignment with each other or not in alignment with each other. The middle member main body provides a complex capillary structure for vapor-liquid circulation of the working fluid. In addition, the middle member main body serves as a support structure integrated with the capillary structure.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 10a is a schematic view of a sixth embodiment of the middle member of heat dissipation device of the present invention;

DETAILED DESCRIPTION OF THE PREFERRED EMBODIMENTS

Figure 1:
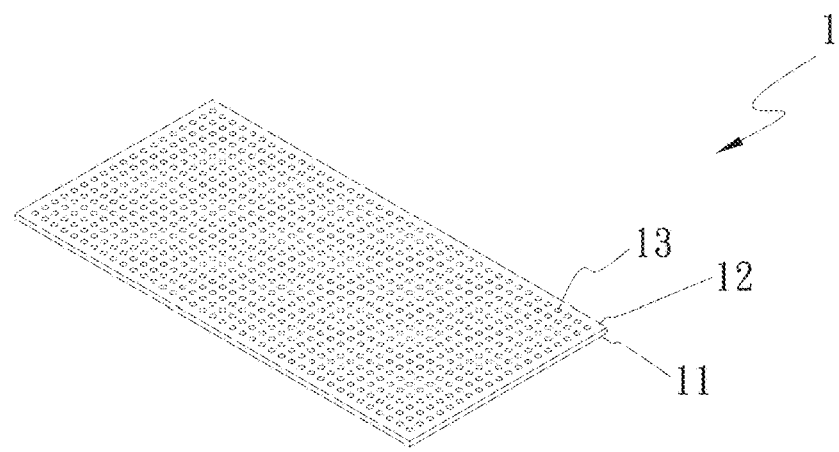
FIG. 1 is a perspective view of a first embodiment of the middle member of heat dissipation device of the present invention.
Figure 2:
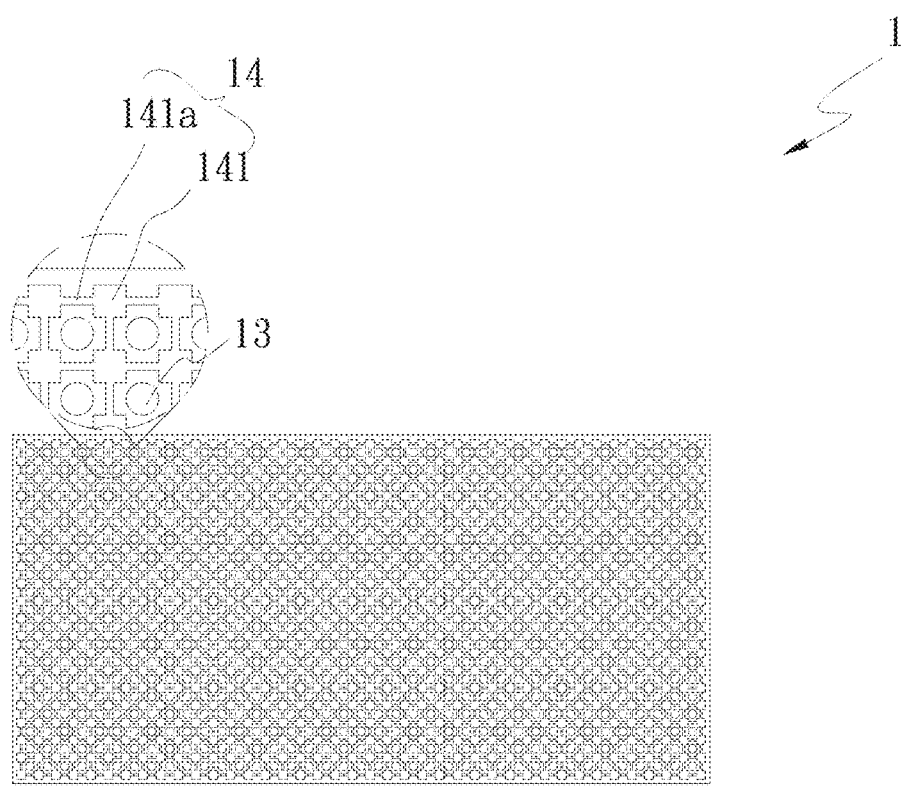
FIG. 2 is a plane view of the first embodiment of the middle member of heat dissipation device of the present invention.

Please refer to FIGS. 1 and 2. FIG. 1 is a perspective view of a first embodiment of the middle member of heat dissipation device of the present invention. FIG. 2 is a plane view of the first embodiment of the middle member of heat dissipation device of the present invention. According to the first embodiment, the middle member of heat dissipation device of the present invention includes a middle member main body 1.

In this embodiment, the middle member main body 1 is selectively an integrated or one-piece structure, which has a first face 11, a second face 12, multiple perforations 13 and a channeled structure assembly 14. The channeled structure assembly 14 can be disposed on the first face 11, the second face 12 or both the first and second faces 11, 12. In this embodiment, the channeled structure assembly 14 is disposed on the first face 11. The perforations 13 are formed through the middle member main body 1 between the first and second faces 11, 12. The channeled structure assembly 14 and the perforations 13 are arranged in alignment with each other or not in alignment with each other. In this embodiment, the channeled structure assembly 14 and the perforations 13 are, but not limited to, arranged not in alignment with each other for illustration purposes.

The channeled structure assembly 14 has multiple recesses 141. The recesses 141 are arranged at intervals and recessed from the first face 11 to the second face 12. The perforations 13 and the recesses 141 are horizontally arranged not in alignment with each other or vertically arranged and overlapped with each other. In this embodiment, the perforations 13 and the recesses 141 are, but not limited to, horizontally arranged not in alignment with each other for illustration purposes. The perforations 13 are formed between each four adjacent recesses 141. At least one communication passage 141*a* is formed between each two recesses 141. Two ends of the communication passage 141*a* are serially connected with the recesses 141, whereby the recesses 141 are transversely and longitudinally communicated with each other.

Figure 3:
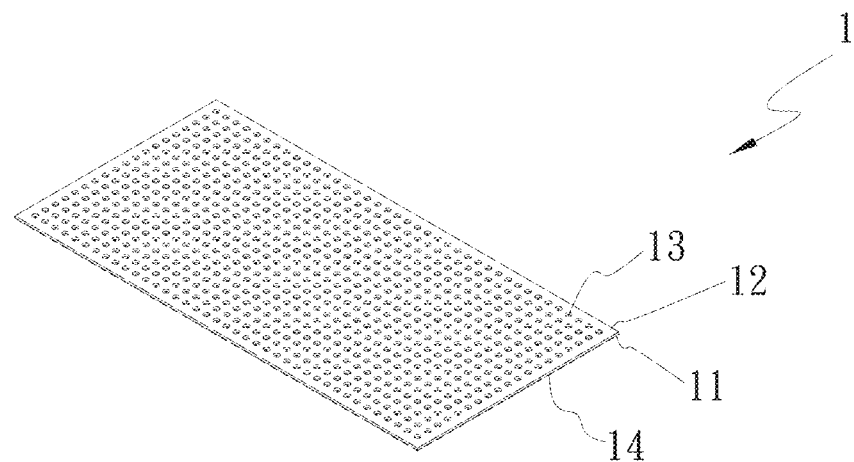
FIG. 3 is a perspective view of a second embodiment of the middle member of heat dissipation device of the present invention.
Figure 4:
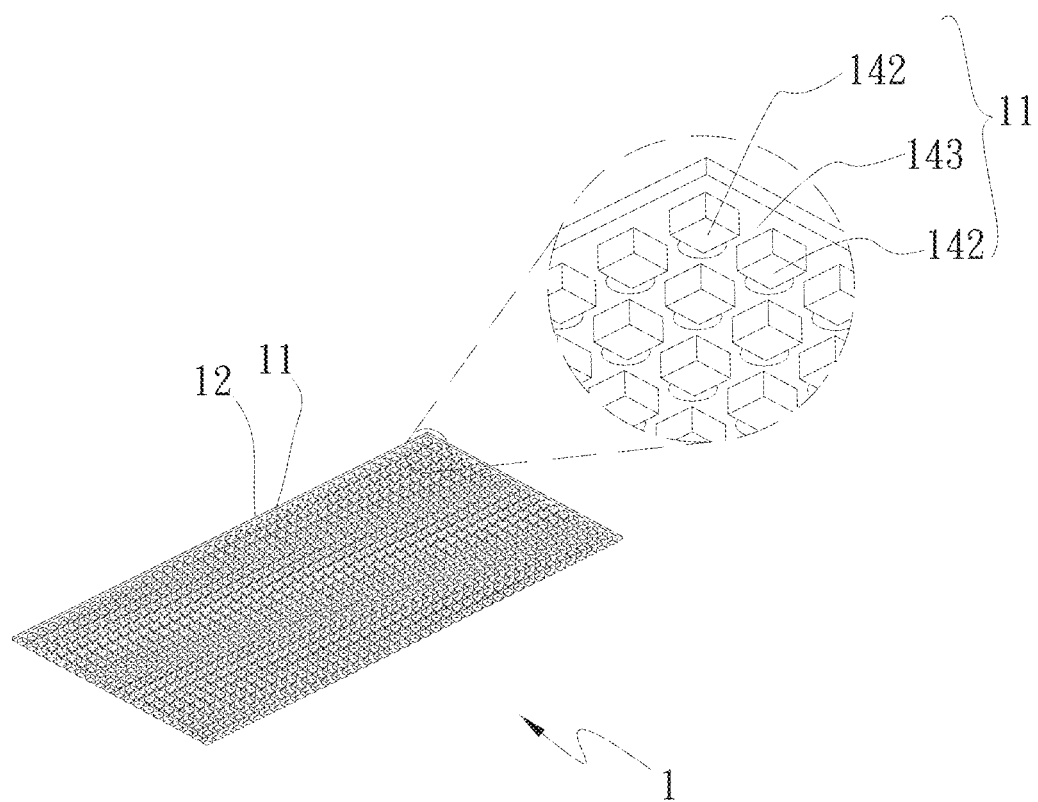
FIG. 4 is another perspective view of the second embodiment of the middle member of heat dissipation device of the present invention.

Please now refer to FIGS. 3 and 4. FIG. 3 is a perspective view of a second embodiment of the middle member of heat dissipation device of the present invention. FIG. 4 is another perspective view of the second embodiment of the middle member of heat dissipation device of the present invention. The second embodiment is different from the first embodiment in that the channeled structure assembly 14 has multiple bosses 142. The bosses 142 are arranged in array at intervals. The bosses 142 define multiple channels 143 therebetween. The perforations 13 and the bosses 142 are horizontally arranged in alignment with or not in alignment with each other (or vertically arranged and overlapped with each other). In this embodiment, the perforations 13 and the bosses 142 are, but not limited to, arranged not in alignment with each other for illustration purposes. The channels 143 are disposed on the first face 11 in the longitudinal direction of the middle member main body 1 or in the transverse direction of the middle member main body 1 or in both the longitudinal and transverse directions of the middle member main body 1 to intersect each other.

Figure 5:
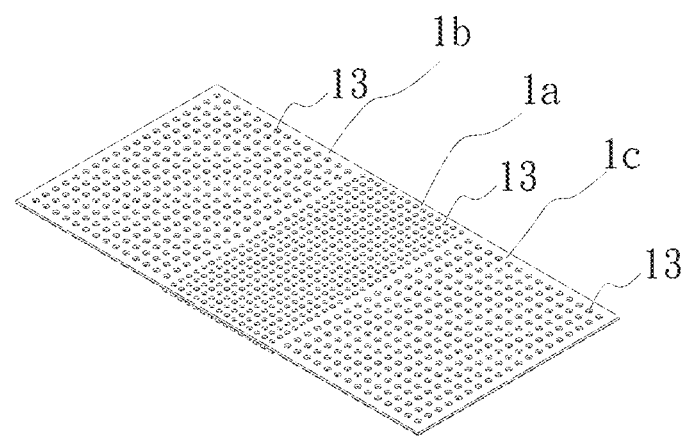
FIG. 5 is a perspective view of a third embodiment of the middle member of heat dissipation device of the present invention.
Figure 6:
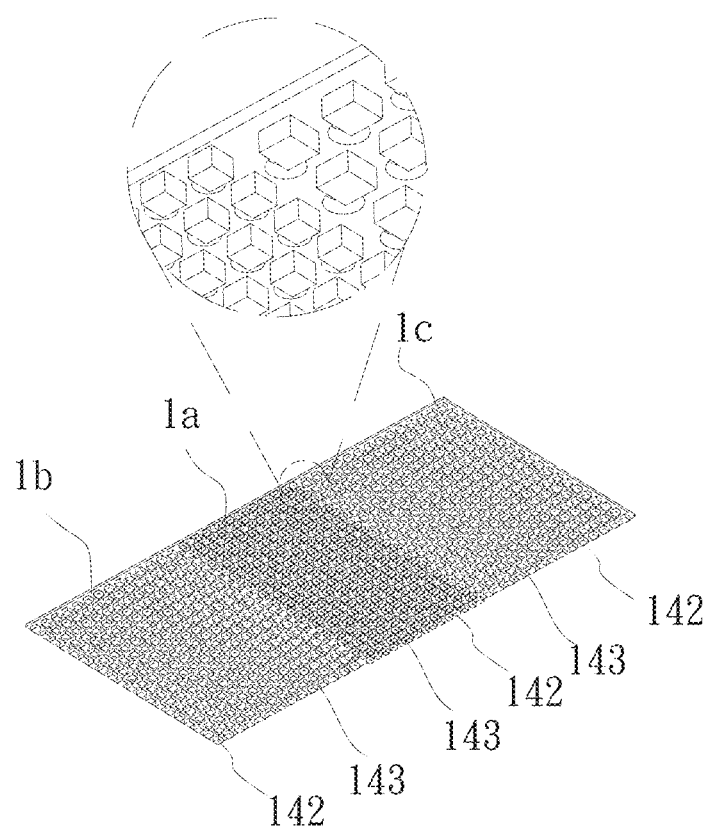
FIG. 6 is another perspective view of the third embodiment of the middle member of heat dissipation device of the present invention.

Please now refer to FIGS. 5 and 6. FIG. 5 is a perspective view of a third embodiment of the middle member of heat dissipation device of the present invention. FIG. 6 is another perspective view of the third embodiment of the middle member of heat dissipation device of the present invention. The third embodiment is different from the second embodiment in that the middle member main body 1 is defined with a first section 1*a*, a second section 1*b* and a third section 1*c*. Two ends of the first section 1*a* are connected with the second and third sections 1*b*, 1*c*. The width of the channels 143 between the bosses 142 of the first section 1*a* is smaller than the width of the channels 143 between the bosses 142 of the second and third sections 1*b*, 1*c*. (That is, the bosses 142 of the first section 1*a* are more densely arranged than the bosses 142 of the second and third sections 1*b*, 1*c*). The diameter of the perforations 13 of the first section 1*a* is smaller than the diameter of the perforations 13 of the second and third sections 1*b*, 1*c*. The first section 1*a* is an evaporation section, while the second and third sections 1*b*, 1*c* are condensation sections. The volume of the bosses 142 of the first section 1*a* is smaller than the volume of the bosses 142 of the second and third sections 1*b*, 1*c*. Accordingly, the width of the channels 143 of the first section 1*a* is smaller than the width of the channels 143 of the second and third sections 1*b*, 1*c*. (That is, the bosses 142 of the first section 1*a* are more densely arranged than the bosses 142 of the second and third sections 1*b*, 1*c*).

Figure 7:
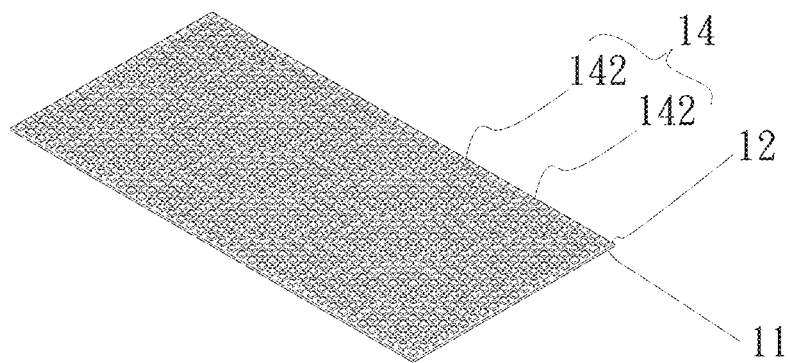
FIG. 7 is a perspective view of a fourth embodiment of the middle member of heat dissipation device of the present invention.
Figure 8:
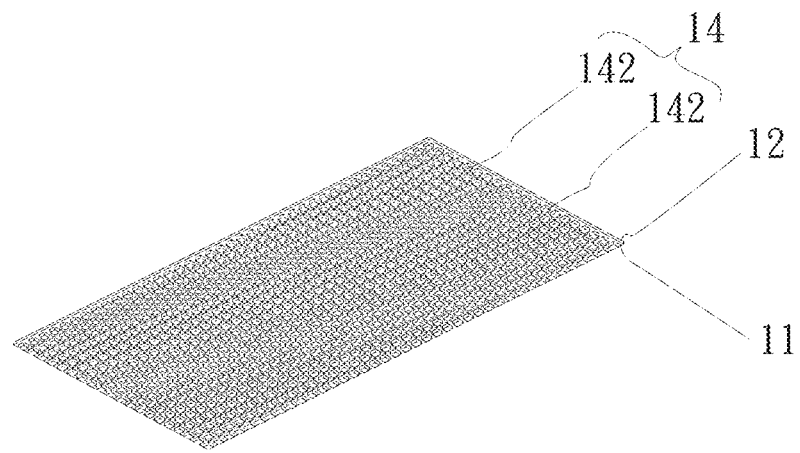
FIG. 8 is another perspective view of a third embodiment of the middle member of heat dissipation device of the present invention.
Figure 8A:
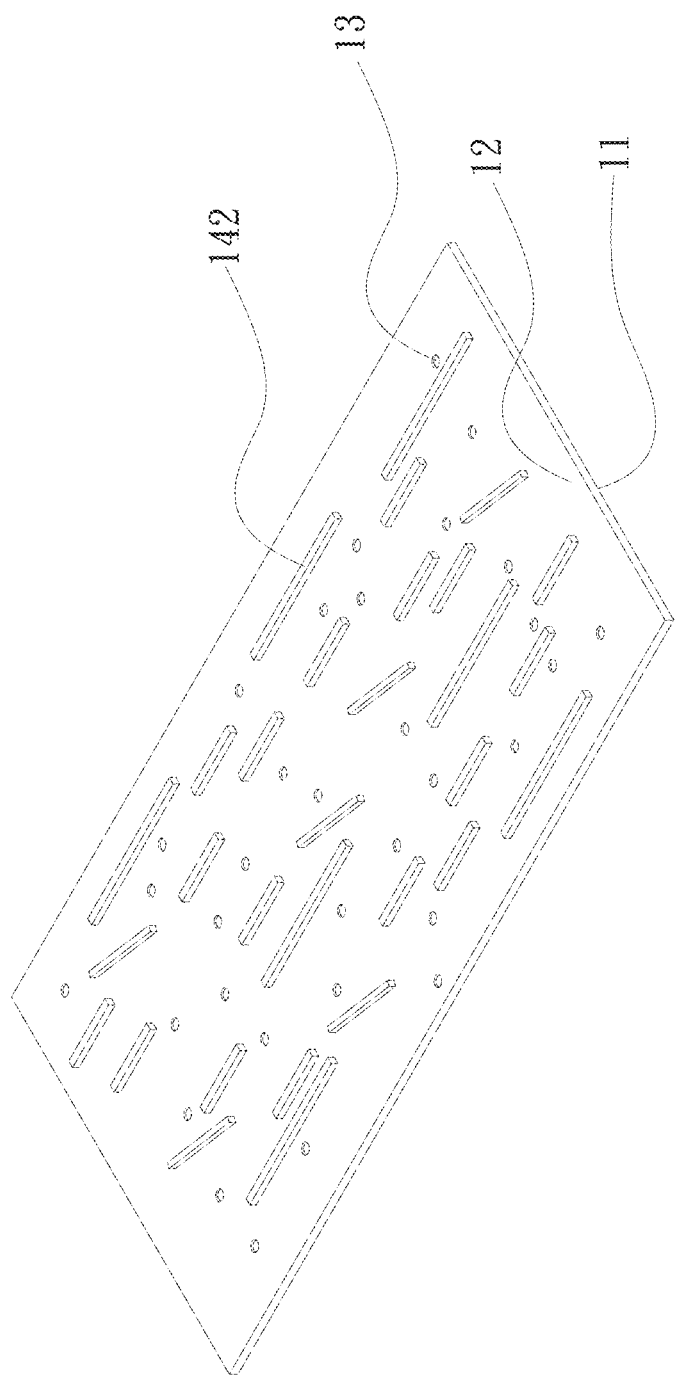
FIG. 8a is another perspective view of a third embodiment of the middle member of heat dissipation device of the present invention.

Please now refer to FIGS. 7, 8 and 8*a*. FIG. 7 is a perspective view of a fourth embodiment of the middle member of heat dissipation device of the present invention. FIG. 8 is another perspective view of a third embodiment of the middle member of heat dissipation device of the present invention. FIG. 8*a* is another perspective view of a third embodiment of the middle member of heat dissipation device of the present invention. The fourth embodiment is different from the first embodiment in that the first and second faces 11, 12 of the middle member main body 1 are both formed with channeled structures 14. The channeled structures 14 can be multiple recesses 141 or multiple bosses 142 or a combination of multiple recesses 141 and multiple bosses 142. In this embodiment, the channeled structures 14 are, but not limited to, multiple bosses 142 for illustration purposes. In a modified embodiment, the channeled structures 14 are a combination of multiple bosses 142 and multiple perforations 13, which are irregularly randomly arranged. The configuration and the size of the bosses 142 and the perforations 13 are not specifically limited (as shown in FIG. 8*a*).

In the above embodiments, the cross section of the recesses 141 or the bosses 142 has, but not limited to, a geometrical configuration selected from a group consisting of circular, elliptic, quadrangular, rhombic and triangular configuration. The cross section means the cross-sectional shape horizontally extending along the first face 11 or the second face 12 of the middle member main body 1. The middle member main body 1 is made of a material selected from a group consisting of pure titanium, titanium alloy, copper, aluminum, stainless steel and ceramic material.

Figure 9A:
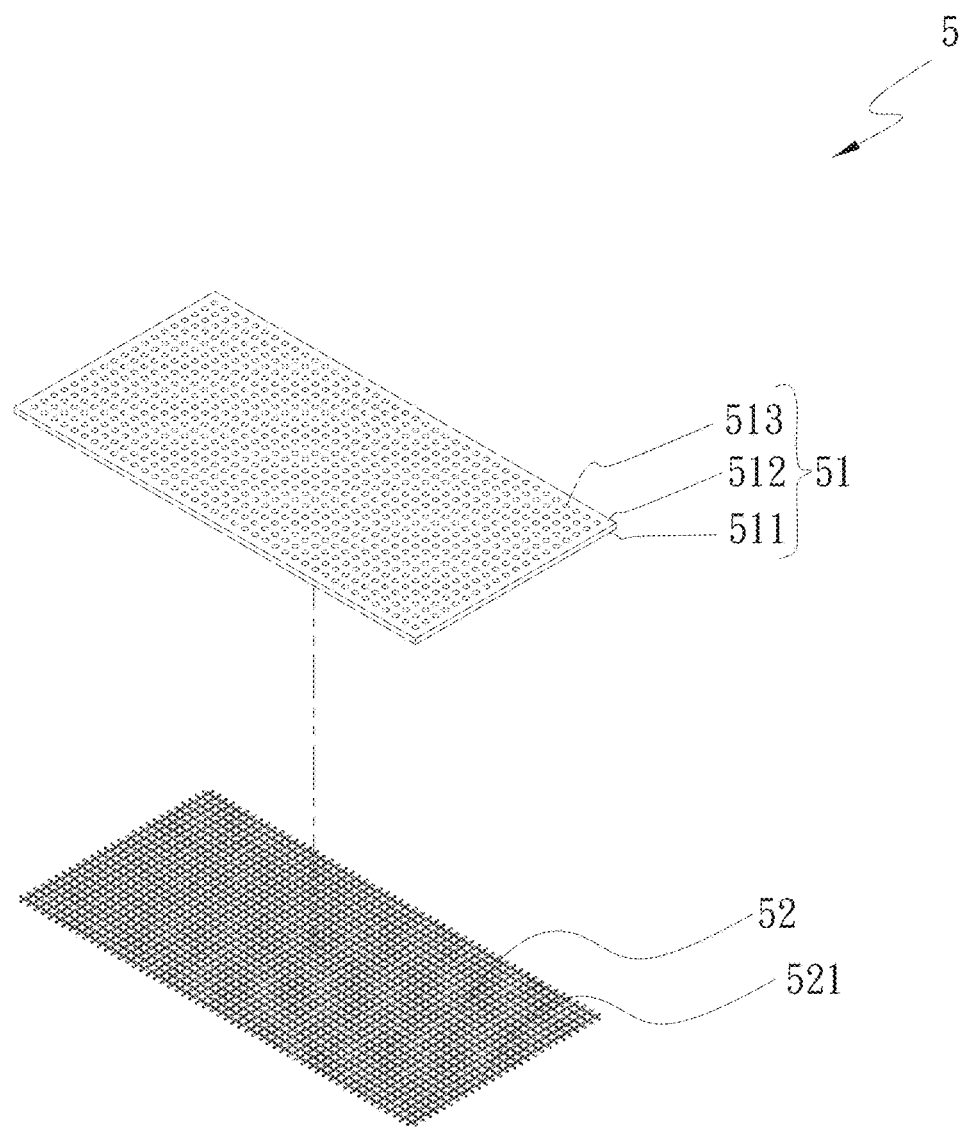
FIG. 9a is a sectional view of a fifth embodiment of the middle member of heat dissipation device of the present invention.
Figure 9B:
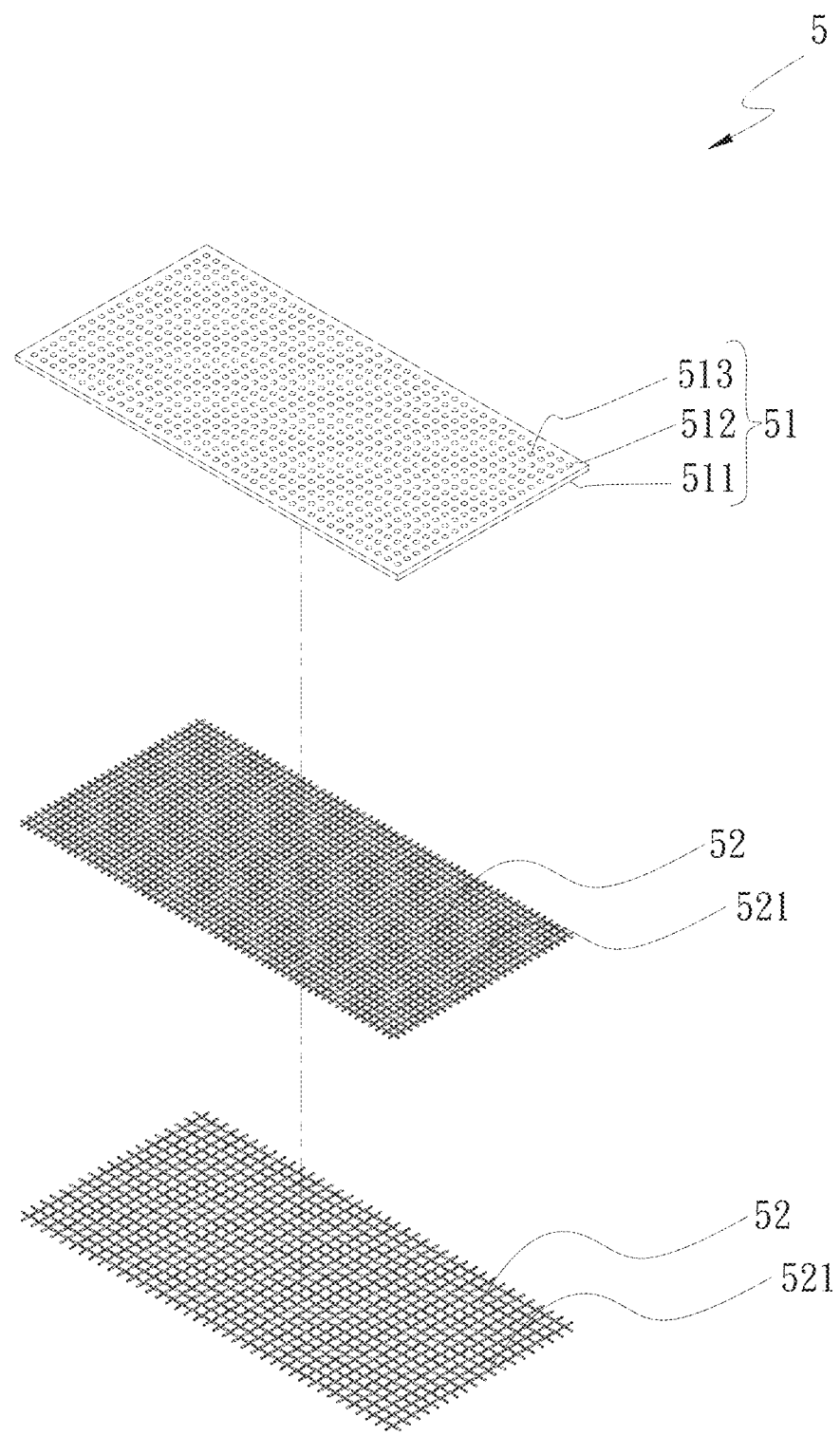
FIG. 9b is a sectional view of a fifth embodiment of the middle member of heat dissipation device of the present invention.
Figure 9C:
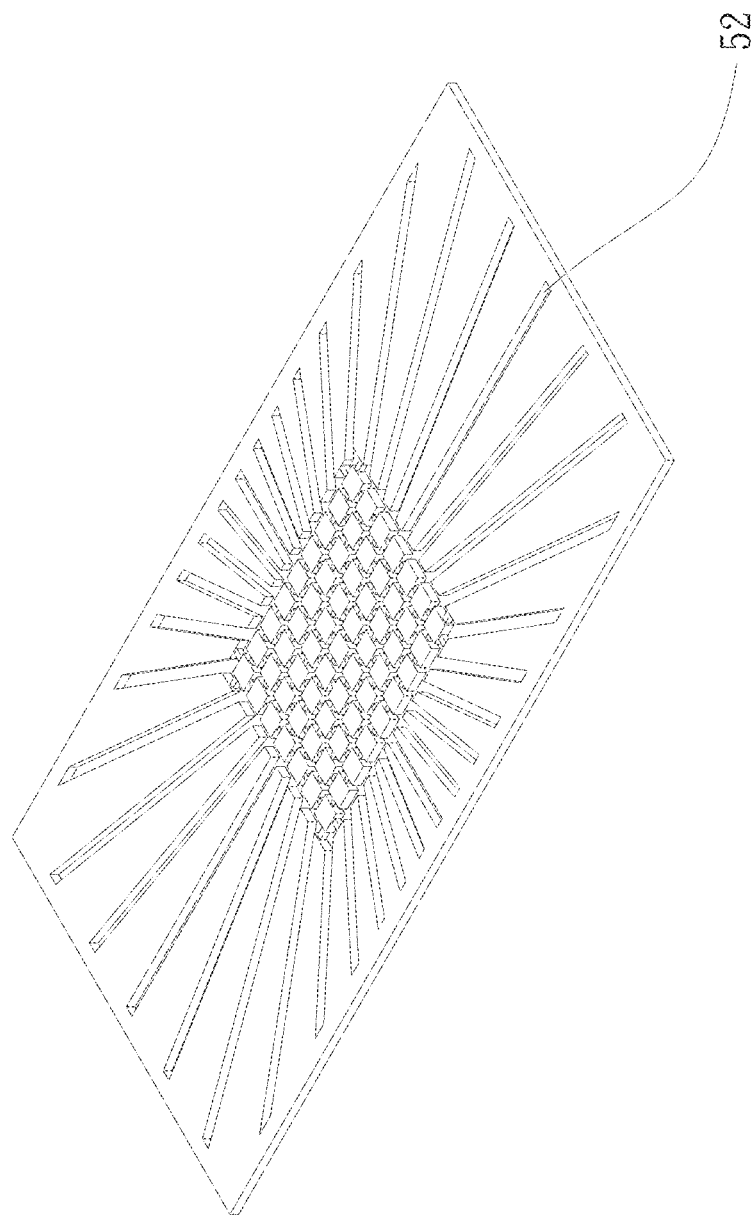
FIG. 9c is a perspective exploded view of the channeled structure assembly of the middle member of heat dissipation device of the present invention.
Figure 9D:
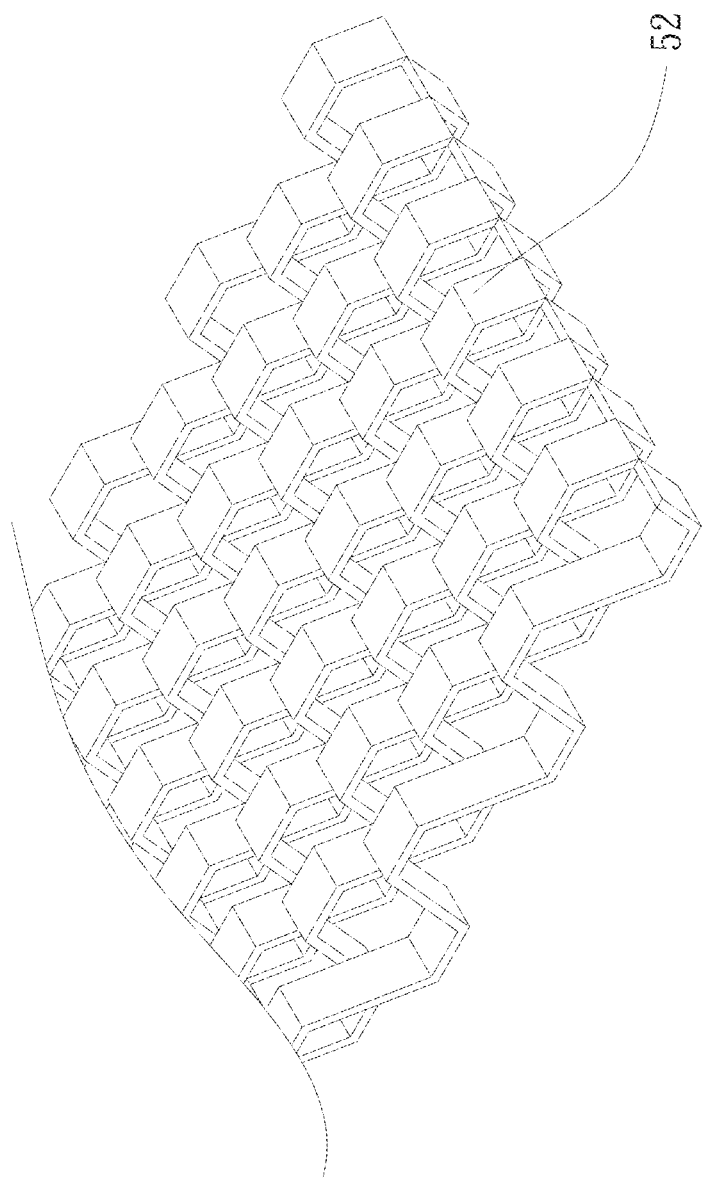
FIG. 9d is a perspective exploded view of the channeled structure assembly of the middle member of heat dissipation device of the present invention.
Figure 9E:
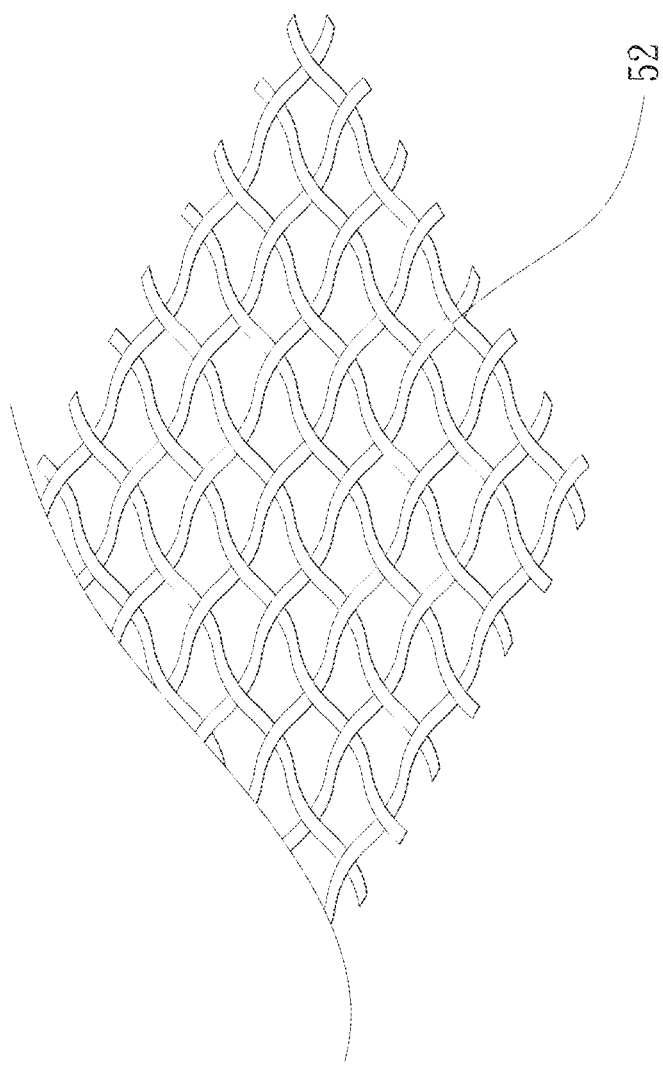
FIG. 9e is a schematic view of the channeled structure assembly of the middle member of heat dissipation device of the present invention.

Please now refer to FIGS. 9*a*, 9*b*, 9*c*, 9*d* and 9*e*. FIG. 9*a* is a sectional view of a fifth embodiment of the middle member of heat dissipation device of the present invention. FIG. 9*b* is a sectional view of a fifth embodiment of the middle member of heat dissipation device of the present invention. FIG. 9*c* is a perspective exploded view of the channeled structure assembly of the middle member of heat dissipation device of the present invention. FIG. 9*d* is a perspective exploded view of the channeled structure assembly of the middle member of heat dissipation device of the present invention. FIG. 9*e* is a schematic view of the channeled structure assembly of the middle member of heat dissipation device of the present invention. As shown in the drawings, the fifth embodiment is different from the first embodiment in that the middle member main body 5 is selectively a multi-piece unit assembly structure, which has a substrate 51 and a channeled structure assembly 52, which are overlapped and assembled with each other.

The substrate 51 has a first face 511, a second face 512 and multiple perforations 513. The perforations 513 are formed through the substrate 51 between the first and second faces 511, 512.

Figure 9H:
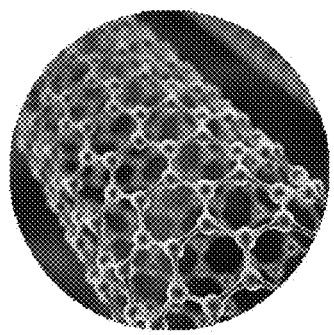
FIG. 9h is a schematic view of the channeled structure assembly of the middle member of heat dissipation device of the present invention.
Figure 9G:
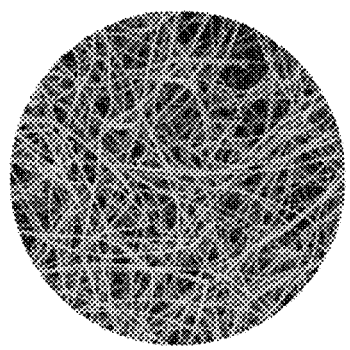
FIG. 9g is a schematic view of the channeled structure assembly of the middle member of heat dissipation device of the present invention.
Figure 9F:
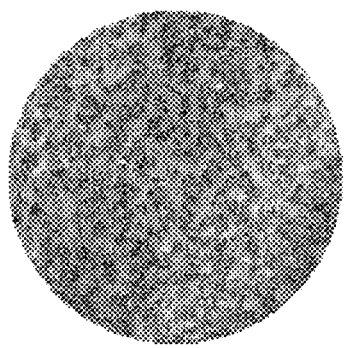
FIG. 9f is a schematic view of the channeled structure assembly of the middle member of heat dissipation device of the present invention.

In this embodiment, the channeled structure assembly 52 is one single layer of mesh body (as shown in FIG. 9*a*) or multiple layers of mesh bodies (as shown in FIG. 9*b*). The mesh body has multiple meshes 521. Alternatively, the channeled structure assembly 52 can be otherwise a structure body capable of providing capillary attraction, which is selected from a group consisting of a hollow member with channels or flow ways or passages (as shown in FIG. 9*c*), a waved plate composed of multiple waved strip bodies up and down alternately arranged (as shown in FIG. 9*d*), a woven mesh composed of multiple thread bodies woven with each other (as shown in FIG. 9*e*) and a porous structure body formed by means of electrolysis, electrocasting or chemical or physical vapor deposition and having capillary attraction (as shown in FIGS. 9f, 9g and 9h). Alternatively, the channeled structure assembly 52 can be a structure body of combination of the above 9a, 9c, 9d, 9e, 9f, 9g, 9h.

In FIG. 9b, the sizes of the meshes 521 of the multiple layers of mesh bodies can be selectively equal to or unequal to each other. In addition, the mesh bodies can be first overlapped and assembled with each other and then assembled with the substrate 51 by means of engagement, welding, insertion, press fit, adhesion, laser fusion, etc.

The aforesaid various channeled structure assemblies 52 as shown in the drawings can provide capillary attraction and water sucking force necessary for the liquid working fluid to flow back. Accordingly, the vapor-liquid circulation efficiency can be enhanced and the water content in the evaporation section can be increased to avoid dry burn.

Figure 10B:
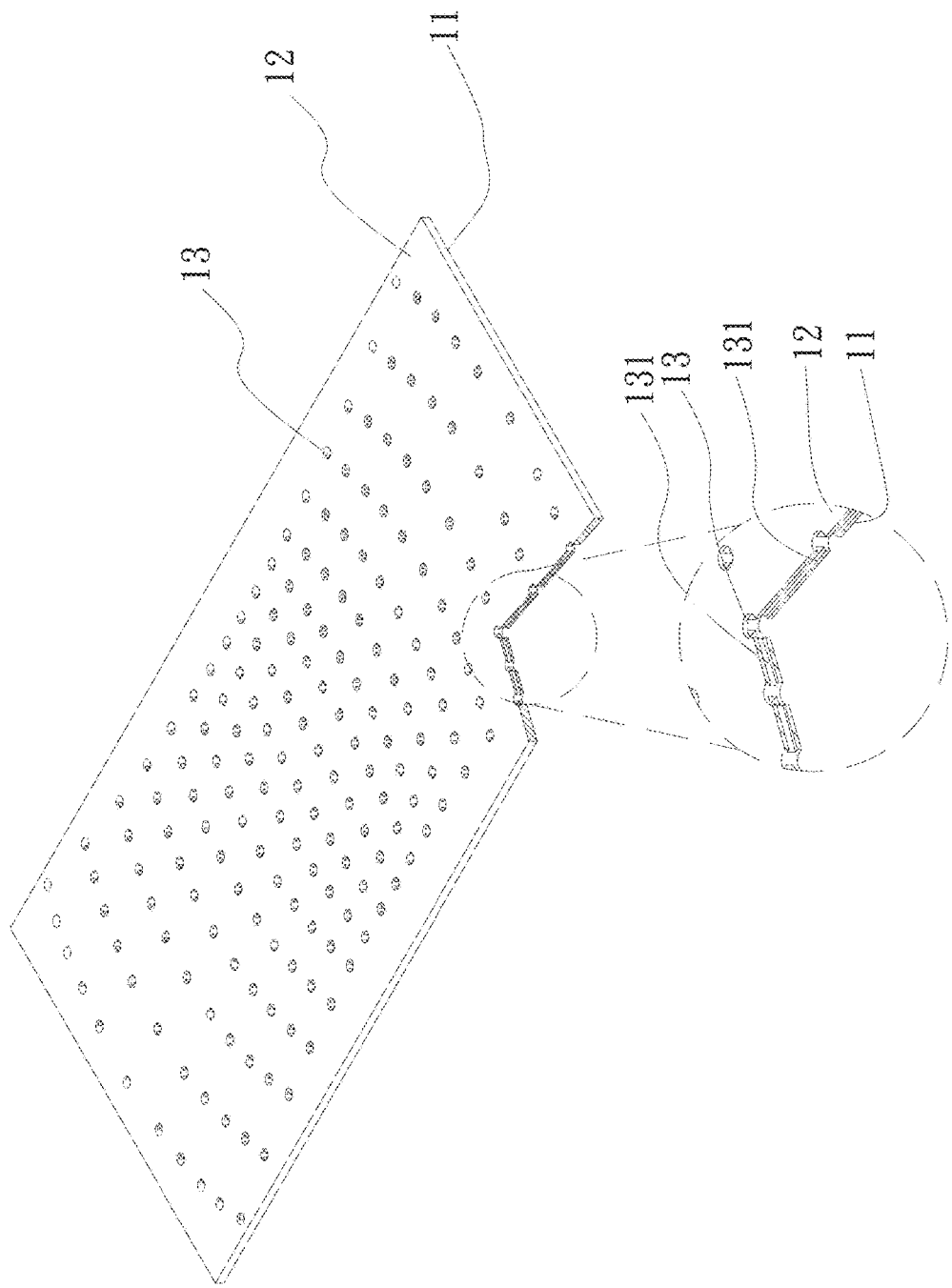
FIG. 10b is a schematic view of a sixth embodiment of the middle member of heat dissipation device of the present invention.
Figure 11:
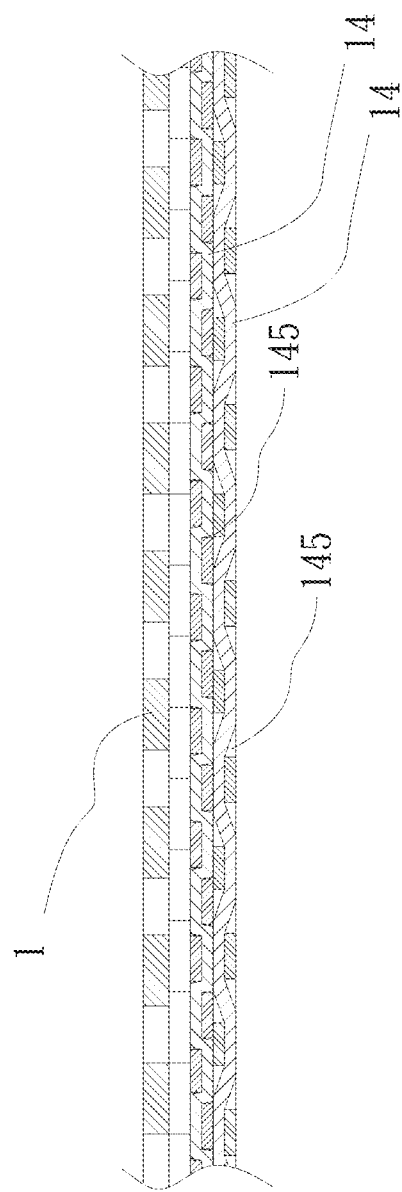
FIG. 11 is a sectional view of a seventh embodiment of the middle member of heat dissipation device of the present invention.

Please now refer to FIGS. 10a and 10b. FIG. 10a is a schematic view of a sixth embodiment of the middle member of heat dissipation device of the present invention. FIG. 10b is a schematic view of a sixth embodiment of the middle member of heat dissipation device of the present invention. The sixth embodiment is different from the first embodiment in that the perforations 13 have multiple connection passages 131 in horizontal direction. The connection passages 131 horizontally extend to connect two adjacent perforations 13 in a linear form, a curve form or an irregular form. The connection passages 131 are disposed on any of the first and second faces 11, 12 or both the first and second faces 11, 12. In this embodiment, the connection passages 131 are, but not limited to, disposed on the second face 12 (as shown in FIG. 10a) or disposed between the first and second faces 11, 12 of the middle member main body 1 (as shown in FIG. 10b) for illustration purposes. The connection passages 131 permit the perforations 13 to also communicate with each other in horizontal direction. That is, when the working fluid 4 is converted into vapor phase, the working fluid 4 not only can spread in vertical direction, but also can spread in horizontal direction Please now refer to FIG. 11, which is a sectional view of a seventh embodiment of the middle member of heat dissipation device of the present invention. The seventh embodiment is different from the first embodiment in that at least one mesh body 16 is attached to one face of the channeled structure assembly 14. The mesh body 16 has multiple meshes 161. There can be multiple mesh bodies 16, which are overlapped with each other and attached to one face of the channeled structure assembly 14 and integrated with the middle member main body 1. The sizes of the meshes 161 of the mesh bodies 16 can be equal to or unequal to each other.

Figure 12B:
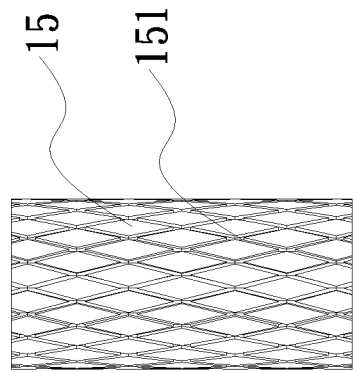
FIGS. 12a and 12b are two schematic view of the support structure of the middle member of heat dissipation device of the present invention.
Figure 12A:
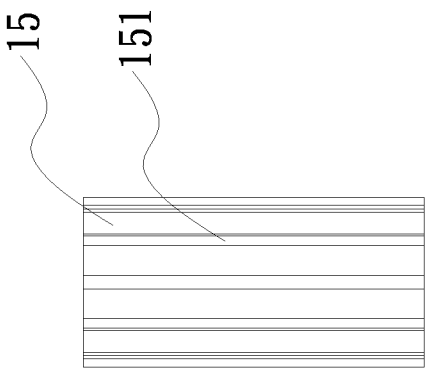

Please now refer to FIGS. 12a and 12b. The present invention further includes a support structure 15. The support structure 15 is made of a material selected from a group consisting of copper, aluminum, iron, stainless steel, ceramic material, commercial pure titanium, titanium alloy, copper alloy and aluminum alloy. The support structure 15 is a solid column body or a hollow collar body. An outer surface of the support structure 15 is formed with multiple channels 151. The channels 151 extend in a direction parallel or unparallel to the axial direction of the support structure 15 or intersecting each other or not intersecting each other. The channels 151 are formed by means of embossing, thread forming or channel drawing. In this embodiment, the extending direction of the channels 151 is, but not limited to, parallel to the axial direction of the support structure 15 for illustration purposes.

The widths of two ends of the channels 151 formed on the outer surface of the support structure 15 are equal to or unequal to each other. The channels 151 have a trapezoidal shape or conic shape.

Figure 13:
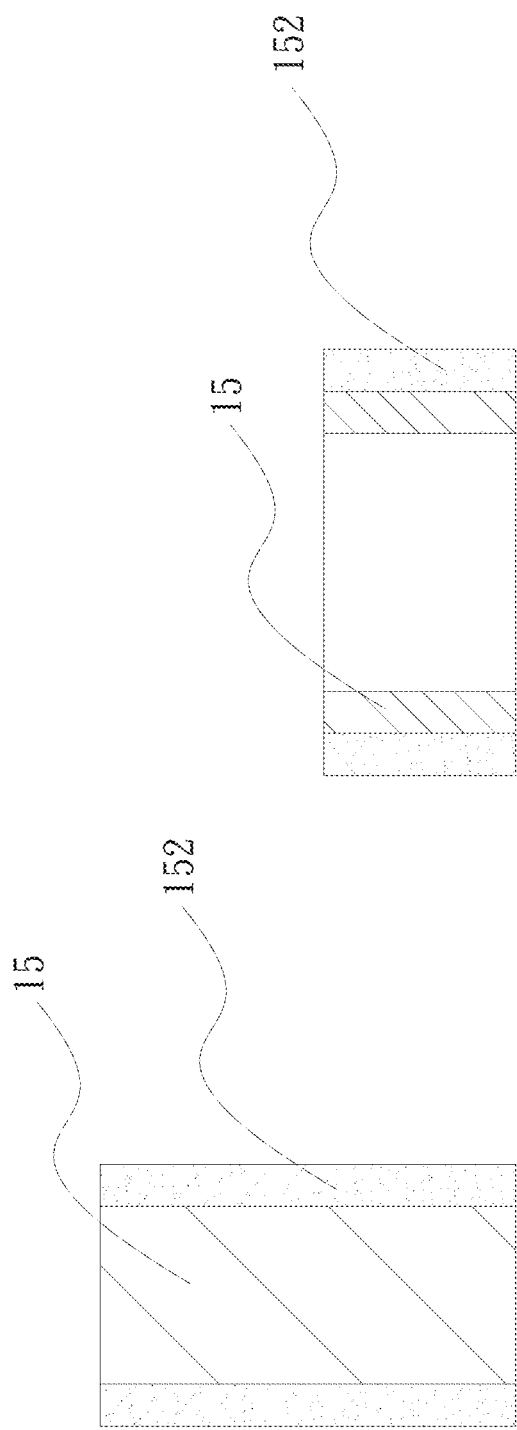
FIG. 13 is a schematic view of the support structure of the middle member of heat dissipation device of the present invention.

Please refer to FIG. 13. The support structure 15 is a solid column body or a hollow collar body. A porous structure layer 152 formed of sintered powder is disposed on outer side of the support structure 15.

The support structure 15 as shown in FIGS. 11a~13 are applicable to the aforesaid first to seventh embodiments and freely co-used with the middle member main bodies 1 of the respective embodiments.

Figure 14:
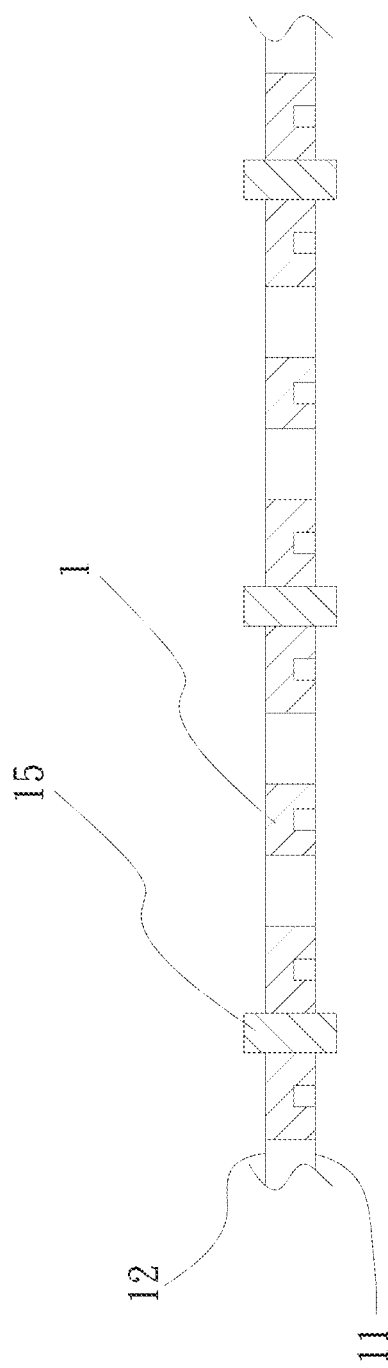
FIG. 14 is a sectional view of an eighth embodiment of the middle member of heat dissipation device of the present invention.

Please now refer to FIG. 14, which is a sectional view of an eighth embodiment of the middle member of heat dissipation device of the present invention. In this embodiment, the aforesaid support structure 15 is assembled and co-used with the middle member main body 1. The support structure 15 is a solid column body passing through the first and second faces 11, 12 of the middle member main body 1. Two ends of the solid column body pass through the middle member main body 1 and outward protrude from the first and second faces 11, 12 of the middle member main body 1.

Figure 15:
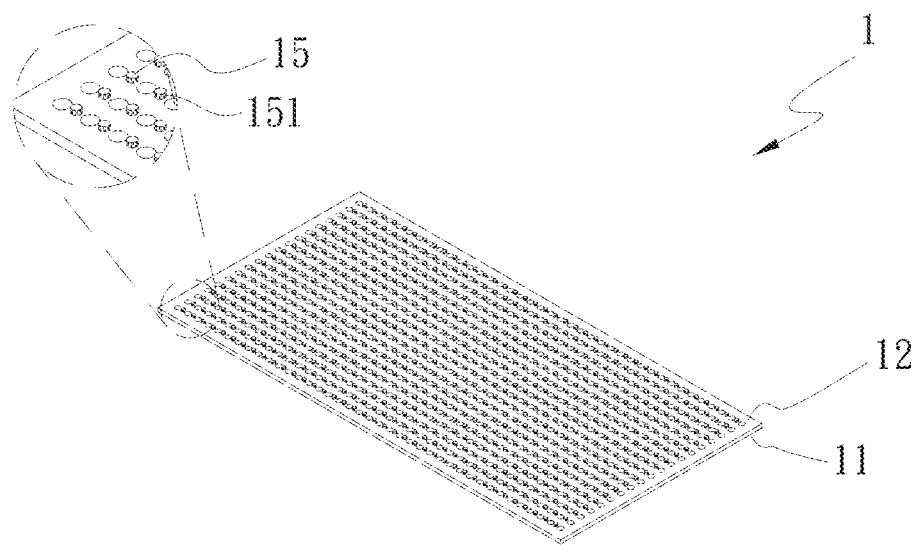
FIG. 15 is a perspective view of a ninth embodiment of the middle member of heat dissipation device of the present invention.
Figure 15A:
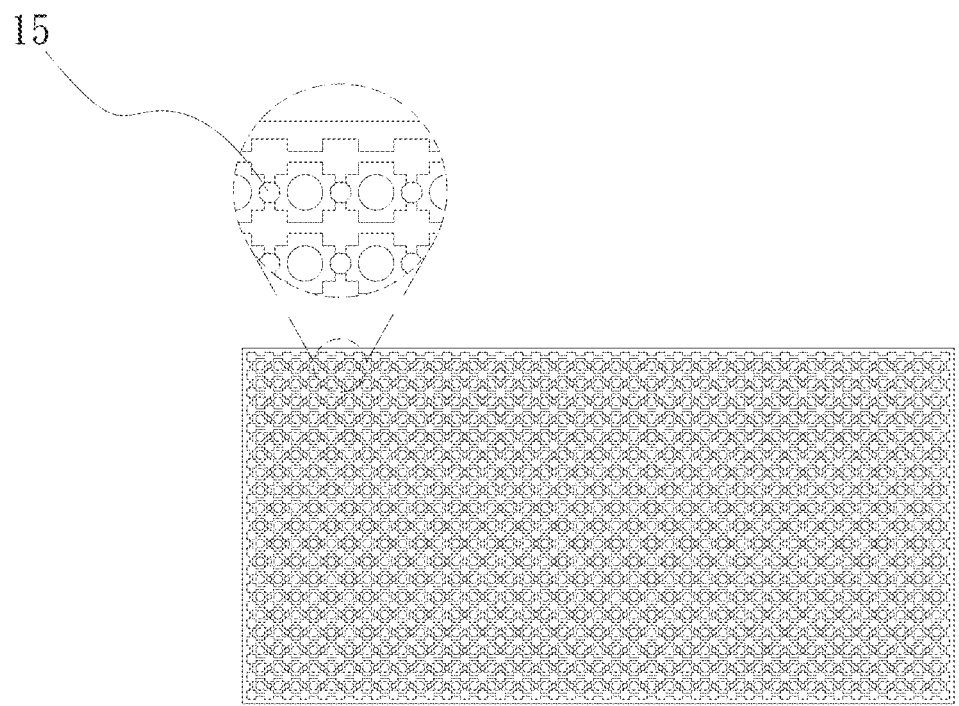
FIG. 15a is a bottom view of the ninth embodiment of the middle member of heat dissipation device of the present invention.
Figure 15B:
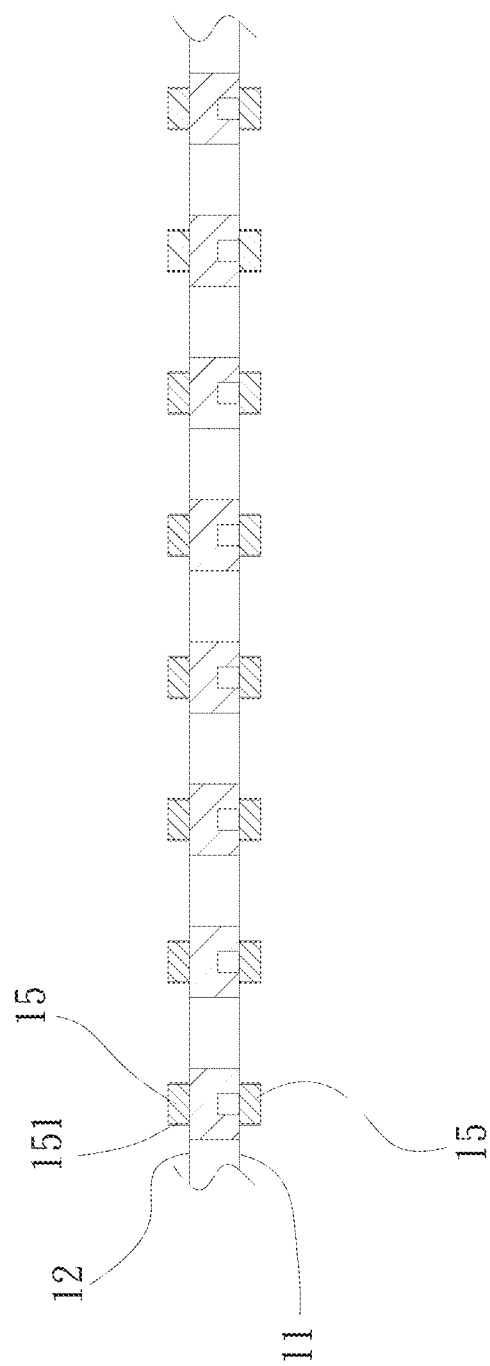
FIG. 15b is a sectional view of the ninth embodiment of the middle member of heat dissipation device of the present invention.

Please now refer to FIGS. 15, 15a and 15b. FIG. 15 is a perspective view of a ninth embodiment of the middle member of heat dissipation device of the present invention. FIG. 15a is a bottom view of the ninth embodiment of the middle member of heat dissipation device of the present invention. FIG. 15b is a sectional view of the ninth embodiment of the middle member of heat dissipation device of the present invention. The ninth embodiment is different from the eighth embodiment in that the support structure 15 can be disposed on one of the first and second faces 11, 12 or both the first and second faces 11, 12. In this embodiment, the support structure 15 is disposed on both the first and second faces 11, 12 and the support structure 15 is, but not limited to, a solid column body only for illustration purposes.

Figure 16:
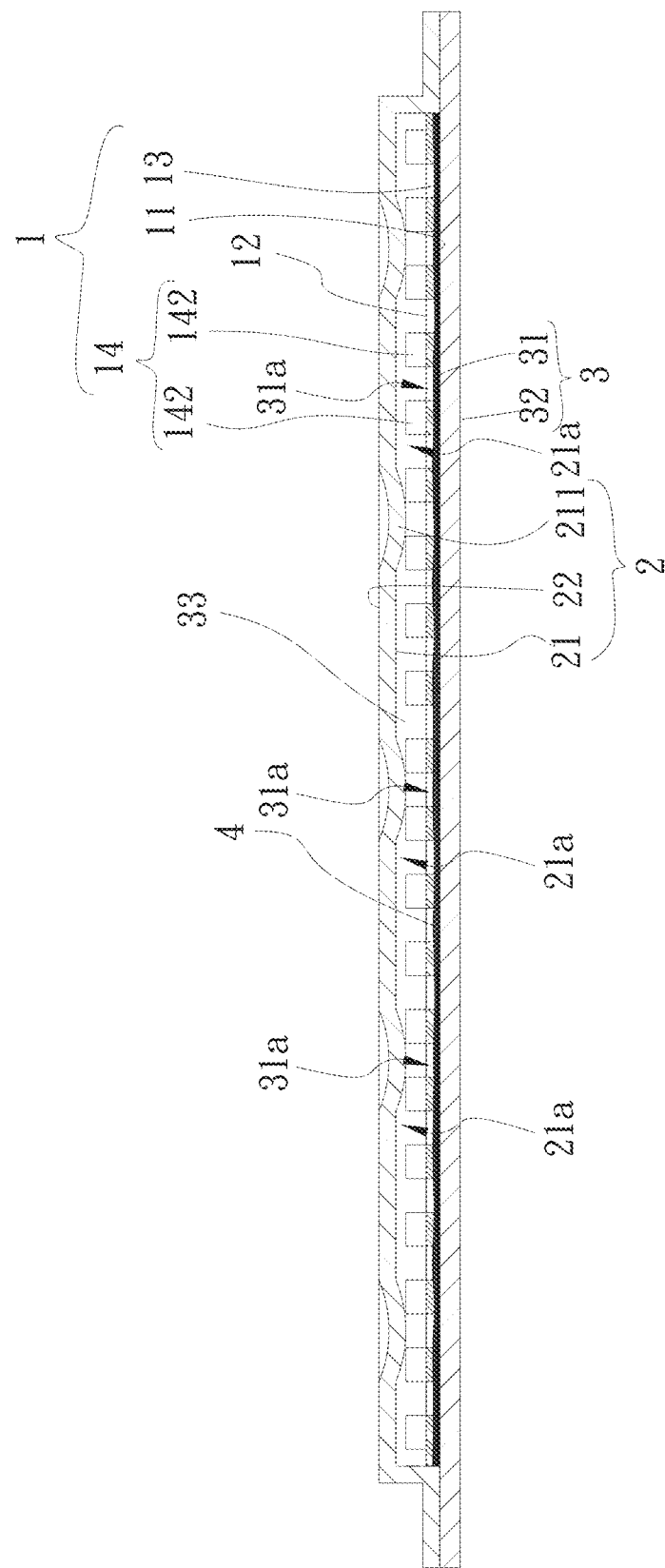
FIG. 16 is a sectional view of a first embodiment of the heat dissipation device of the present invention.

Please now refer to FIG. 16, which is a sectional view of a first embodiment of the heat dissipation device of the present invention. The heat dissipation device of the present invention includes a middle member main body 1, a first plate body 2 and a second plate body 3.

The middle member main body 1 has a first face 11, a second face 12, multiple perforations 13 and a channeled structure assembly 14. The channeled structure assembly 14 is disposed on the first face 11 or the second face 12. The perforations 13 are formed through the middle member main body 1 between the first and second faces 11, 12. The channeled structure assembly 14 and the perforations 13 are arranged in alignment with each other or not in alignment with each other or vertically arranged and overlapped with each other.

The first plate body 2 has a first surface 21 and a second surface 22. The second plate body 3 has a third surface 31 and a fourth surface 32. The first and third surfaces 21, 31 are correspondingly mated with each other to together define a closed chamber 33. The middle member main body 1 is disposed in the closed chamber 33. A working fluid 4 is filled in the closed chamber 33.

In this embodiment, the channeled structure assembly 14 of the middle member main body 1 is composed of multiple recesses 141 or multiple bosses 142. The channeled structure assembly 14 can be selectively disposed on the first face 11, the second face 12 or both the first and second faces 11, 12. In this embodiment, the channeled structure assembly 14 is, but not limited to, only disposed on the second face 12 and the channeled structure assembly 14 is, but not limited to, composed of multiple bosses 142 for illustration purposes. The first surface 21 of the first plate body 2 has multiple raised sections 211. The second surface 22 is formed with multiple depressions in positions opposite to the raised sections 211. The raised sections 211 are correspondingly attached to the second face 12 of the middle member main body 1. The third surface 31 of the second plate body 3 is correspondingly attached to the first face 11 of the middle member main body 1.

Figure 17A:
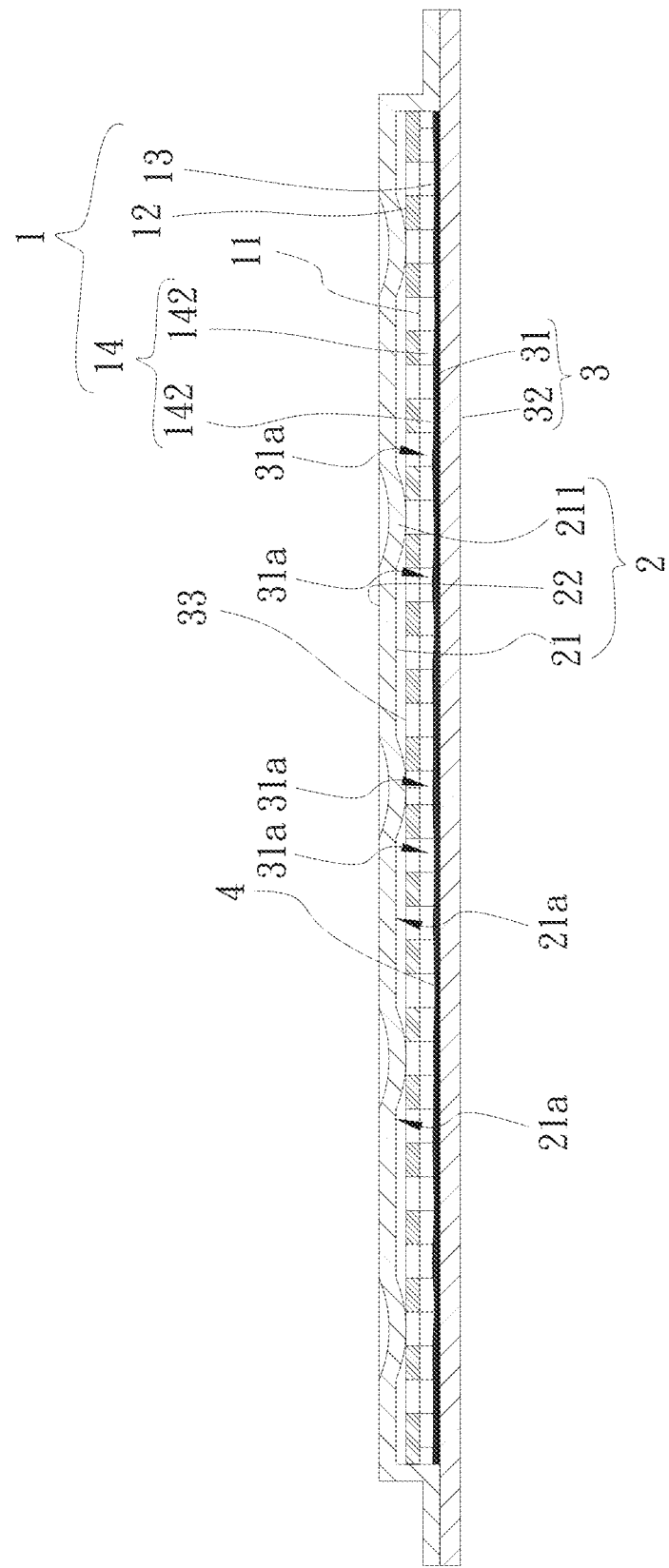
FIG. 17a is a sectional view of a second embodiment of the heat dissipation device of the present invention.
Figure 17B:
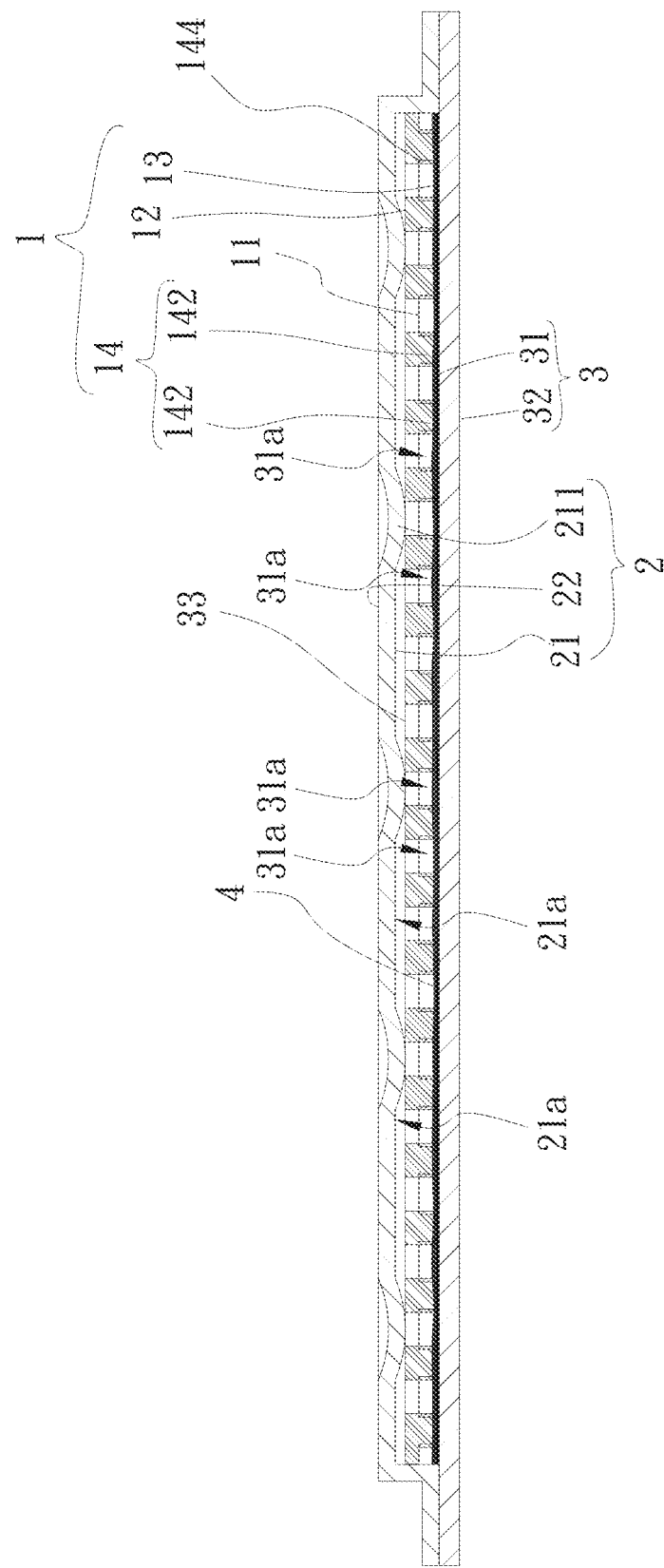
FIG. 17b is another sectional view of the second embodiment of the heat dissipation device of the present invention.

Please now refer to FIGS. 17a and 17b. FIG. 17a is a sectional view of a second embodiment of the heat dissipation device of the present invention. FIG. 17b is another sectional view of the second embodiment of the heat dissipation device of the present invention. The second embodiment is different from the first embodiment in that the raised sections 211 of the first plate body 2 are correspondingly attached to the first face 11 of the middle member main body 1, while the third surface 31 of the second plate body 3 is correspondingly attached to the second face 12 of the middle member main body 1.

In the first and second embodiments of the heat dissipation device of the present invention, the second surface 22 of the first plate body 2 is defined as a condensation face capable of providing condensation effect. At least one section of the first surface 21 is defined as a condensation section 21a. The fourth surface 32 of the second plate body 3 is defined as a heat absorption face 32a capable of absorbing heat. At least one section of the third surface 31 is defined as an evaporation section 31a. In this embodiment, the condensation section 21a and the evaporation section 31a are up and down correspondingly arranged. The middle member main body 1 and the first and second plate bodies 2, 3 are made of a material selected from a group consisting of pure titanium, titanium alloy, copper, aluminum, stainless steel, ceramic material and any combination of the aforesaid materials.

Please now refer to FIG. 17b. In a modified embodiment, the channeled structure assembly 14 is composed of multiple bosses 142 and disposed on the first face 11 of the middle member main body 1. The surface of the channeled structure assembly 14 has a nanometer structure layer 144. The nanometer structure layer 144 is nanometer whisker layer or nanometer carbonized layer or nanometer oxidization layer. The nanometer oxidization layer is copper oxide, titanium oxide or aluminum oxide. The channeled structure assembly 14 is correspondingly attached to the third surface 31 of the second plate body 3. The nanometer structure layer 144 serves to enhance the backflow or water sucking ability of the whole capillary structure.

Figure 18A:
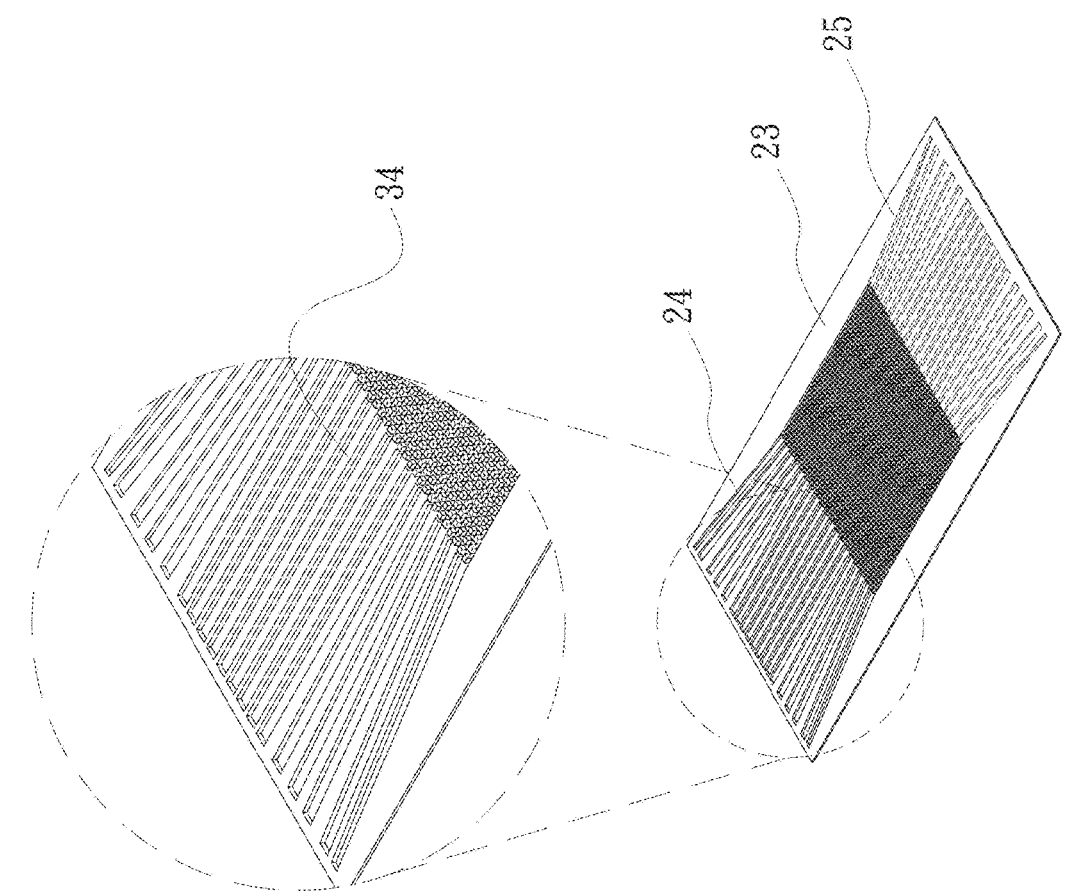
FIG. 18a is a schematic view of the microstructure of the second plate body of the heat dissipation device of the present invention.
Figure 18D:
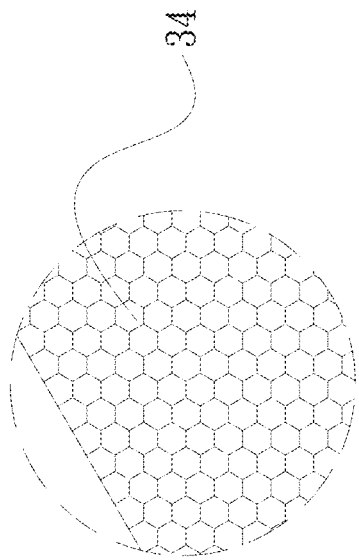
FIG. 18d is a schematic view of the microstructure of the second plate body of the heat dissipation device of the present invention.
Figure 18B:
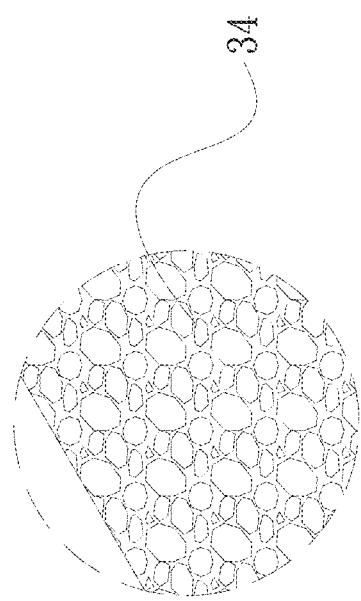
FIG. 18b is a schematic view of the microstructure of the second plate body of the heat dissipation device of the present invention.
Figure 18C:
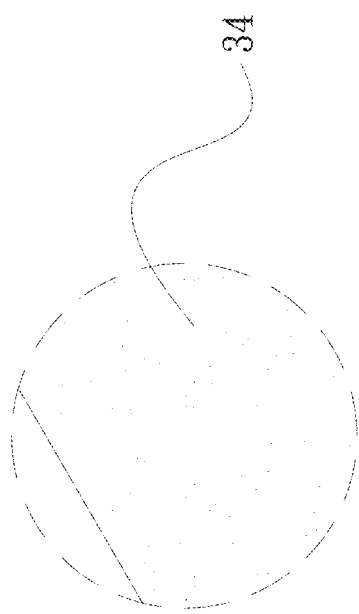
FIG. 18c is a schematic view of the microstructure of the second plate body of the heat dissipation device of the present invention.

Please now refer to FIGS. 18a, 18b, 18c and 18d. In the first and second embodiments of the heat dissipation device of the present invention, a microstructure 34 is disposed on the third surface 31 of the second plate body 3. The microstructure 34 is, but not limited to, a rough face composed of multiple channels (as shown in FIG. 18a) or multiple pits and multiple protrusions (as shown in FIG. 18b) or a sintered powder layer (as shown in FIG. 18c) or a coating layer (as shown in FIG. 18d) or a complex structure of any combination thereof. The microstructure 34 serves to increase the water content so as to enhance the efficiency of vapor-liquid circulation. The coating layer is a hydrophobic layer or a hydrophilic layer. Certainly, a microstructure as the microstructure 34 of the second plate body 3 can be also disposed on the first surface 21 of the first plate body 2.

In this embodiment, the microstructure 34 is composed of multiple micro-channels for illustration purposes. The middle of the third surface 31 of the second plate body 3 is, but not limited to, defined as an evaporation section 23. Either or both of the left end and the right end of the third surface 31 of the second plate body 3 relative to the evaporation section 23 are, but not limited to, defined as condensation ends 24, 25. Certainly, the left end can be alternatively defined as the evaporation section 23, while the right end can be alternatively defined as a condensation end.

In this embodiment, the intervals between the micro-channels 341 disposed on the evaporation section 23 are smaller and the micro-channels 341 are more densely arranged, while the micro-channels 341 disposed on the condensation ends 24, 25 are more sparsely arranged.

In the case that a coating layer is disposed on the second plate body 2, the coating layer disposed on the evaporation section 23 is selectively a hydrophilic coating layer, while the coating layer disposed on the condensation ends 24, 25 are selectively hydrophobic coating layers.

The microstructure 34 (coating layers or micro-channels) mainly serves to enhance the water sucking force to help in increasing the water content of the evaporation section 23 so as to avoid dry burn. The micro-channels 341 are diverged from the middle to the two condensation ends 24, 25 so that the intervals between the micro-channels 341 at the condensation ends 24, 25 are larger, that is, the micro-channels 341 at the condensation ends 24, 25 are more sparsely arranged. Accordingly, the pressure impedance of the condensation ends 24, 25 is reduced to enhance the condensation diffusion efficiency.

Figure 19:
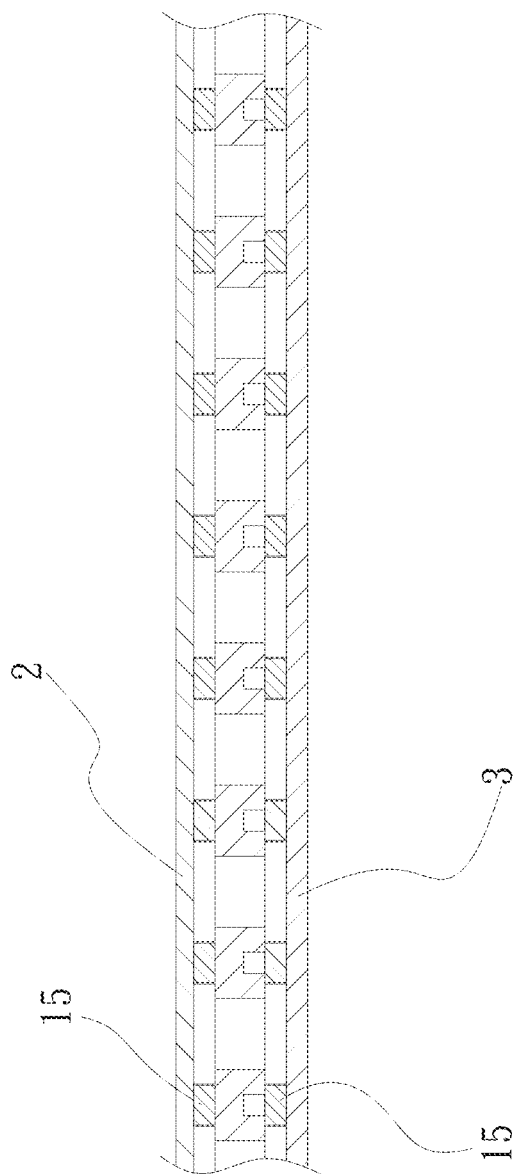
FIG. 19 is a sectional view of a third embodiment of the heat dissipation device of the present invention.

Please now refer to FIG. 19, which is a sectional view of a third embodiment of the heat dissipation device of the present invention. The third embodiment is different from the first embodiment in that the support structure 15 as shown in FIGS. 15, 15a, 15b and correspondingly described in the ninth embodiment is applied to the heat dissipation device of this embodiment. Please also refer to the above description and drawings. The same contents will not be repeatedly described hereinafter.

The support structure 15 respectively abuts against the first plate body 2 and the second plate body 3 to provide supporting effect so as to avoid collapse of the vapor passages.

Figure 20:
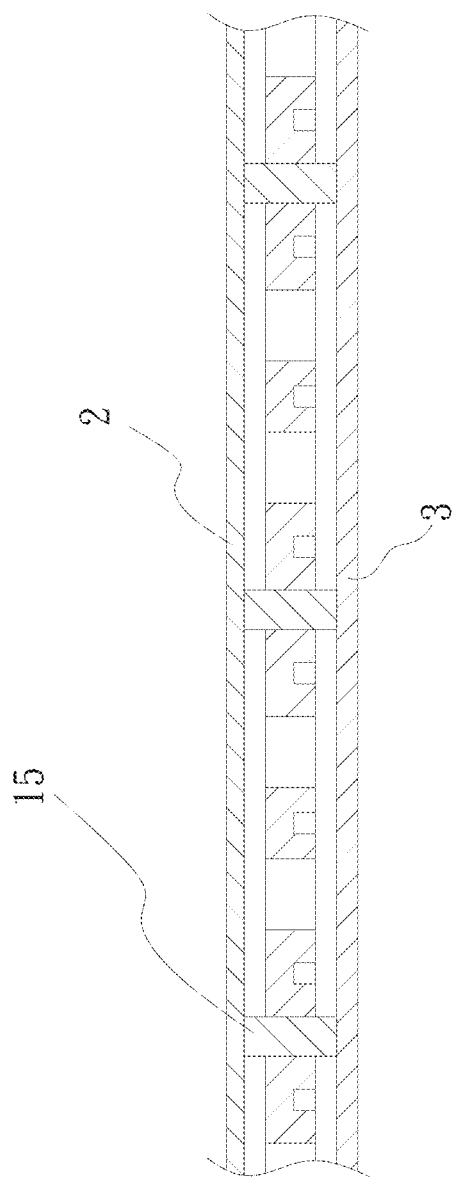
FIG. 20 is a sectional view of a fourth embodiment of the heat dissipation device of the present invention.

Please now refer to FIG. 20, which is a sectional view of a fourth embodiment of the heat dissipation device of the present invention. As shown in the drawing, the middle member structure of the eighth embodiment is added to this embodiment. Please also refer to FIG. 14 and the above description of the eighth embodiment of the middle member. The same contents will not be repeatedly described hereinafter. In this embodiment, two ends of the support structure 15 respectively abut against the first and second plate bodies 2, 3 to provide enhanced supporting effect so as to avoid collapse of the vapor passages.

Figure 21:
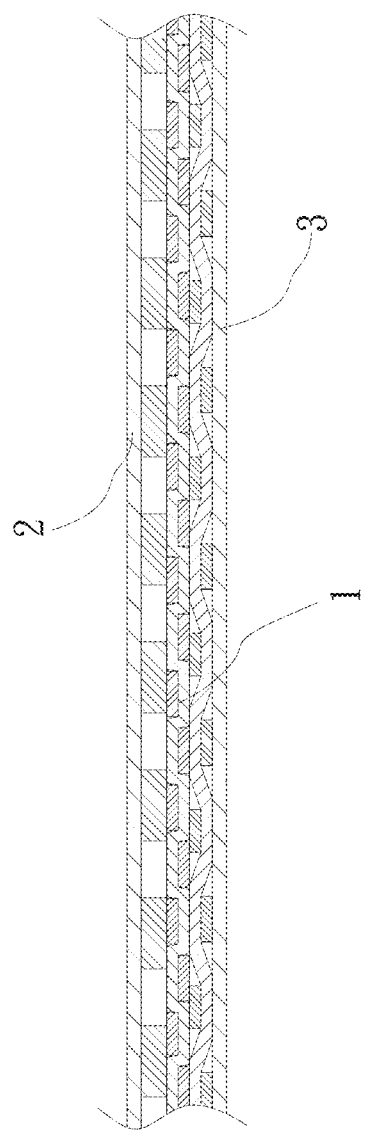
FIG. 21 is a sectional view of a fifth embodiment of the heat dissipation device of the present invention.

Please now refer to FIG. 21, which is a sectional view of a fifth embodiment of the heat dissipation device of the present invention. As shown in the drawing, the middle member structure of the fifth embodiment is applied to the fifth embodiment of the heat dissipation device. Please also refer to the above description of the fifth embodiment of the middle member and FIGS. 9a, 9b, 9c, 9d, 9e. As disclosed in the above fifth embodiment of the middle member, the middle member main body 1, which is not an integrated structure, is disposed between the first and second plate bodies 2, 3. The mesh body provides diffusion passages in horizontal and vertical directions for the vapor or liquid working fluid so as to enhance the vapor-liquid circulation efficiency.

Figure 22:
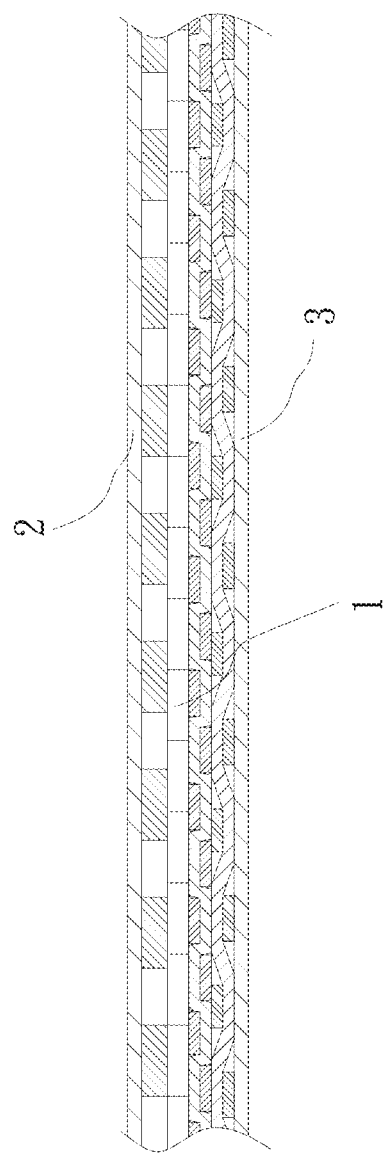
FIG. 22 is a sectional view of the sixth embodiment of the heat dissipation device of the present invention.

Please now refer to FIG. 22, which is a sectional view of a sixth embodiment of the heat dissipation device of the present invention. As shown in the drawing, the fifth embodiment is different from the first embodiment in that the middle member structure of the seventh embodiment is applied to the fifth embodiment. Please also refer to FIG. 11 and the description of the corresponding embodiment. The same contents will not be repeatedly described hereinafter. The middle member main body 1 is disposed between the first and second plate bodies 2, 3 to provide capillary attraction and water sucking force for the liquid working fluid to flow back and the vapor passages for the vapor working fluid so as to enhance the vapor-liquid circulation efficiency and the water content in the evaporation section for avoiding dry burn.

In the present invention, the channeled structure assembly 14 is disposed on one face or both faces of the plate-shaped middle member main body 1. In addition, the middle member main body 1 is formed with the perforations 13. The channeled structure assembly 14 is for the working fluid 4 to flow back, while the perforations 13 serve as the passage of the evaporated working fluid 4. When the heat dissipation device is thinned, the space of the internal closed chamber is narrowed so that it is hard to dispose the capillary structure in the chamber. The plate-shaped middle member main body 1 of the present invention solves this problem. In addition, the plate-shaped middle member main body 1 is uneasy to warp so that the middle member main body 1 can be used without sintering and fixing. The complex structure of the middle member main body 1 has both the vapor circulation passage and the capillary structure for the liquid to flow back on one single layer of substrate. This overcomes the shortcoming that some metal materials such as titanium are uneasy to process into special capillary structure such as woven mesh. Also, the necessary capillary structure can be quickly manufactured. Therefore, the problem of the selection of material is solved and the manufacturing time is shortened to greatly lower the manufacturing cost.

Moreover, the middle member main body 1 can serve as a support, whereby after thinned, the closed chamber can keep complete without being deformed under compression to lose the vapor-liquid circulation effect.

Furthermore, the plate-shaped middle member main body 1 of the present invention can solely provide three-dimensional vapor-liquid circulation passages in axial direction and radial direction without the limitation of a narrow space. Therefore, the working fluid can keep having three-dimensional flowing space to ensure that the vapor-liquid circulation is successfully continuously performed. In the capillary structure of the present invention, the liquid can flow through the channels 143, while the vapor is produced at the semilunar membrane of the surface of the perforation 13 and diffused within the closed chamber 33 to form a vapor-liquid separation heat transfer structure.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A middle member of a heat dissipation device, comprising a middle member main body, the middle member main body being an integrated structure body, the middle member main body having a first face, a second face, multiple perforations and a channeled structure assembly, the channeled structure assembly being disposed on the first face or the second face and having multiple recesses, and at least one communication passage is formed between adjacent pairs of recesses, opposed ends of each of the communicating passages being serially connected with their associated recesses the perforations being formed through the middle member main body between the first and second faces and surrounded by, but not intersecting the channeled structure assembly, the recesses being arranged at intervals and extending from the first face to the second face, the perforations and the recess is being horizontally arranged not in alignment with each other;

wherein liquid can flow through the channeled structure assembly while vapor can diffuse through the multiple perforations to form a vapor-liquid separation heat transfer structure.

2. The middle member of a heat dissipation device as claimed in claim 1, wherein the channeled structure assembly has multiple bosses, the bosses being arranged in an array at intervals, the bosses defining multiple channels therebetween, the perforations and the bosses being horizontally arranged not in alignment with each other or the bosses being vertically arranged corresponding to each other.

3. The middle member of a heat dissipation device as claimed in claim 2, wherein the channels are disposed on the first face in a longitudinal direction of the middle member main body or in a transverse direction of the middle member main body or in both the longitudinal and transverse directions of the middle member main body to intersect each other.

4. The middle member of a heat dissipation device as claimed in claim 2, wherein the channels are disposed on the first face in a longitudinal direction or in a transverse direction or in both the longitudinal and transverse directions to intersect each other.

5. The middle member of a heat dissipation device as claimed in claim 1, wherein the cross section of the recesses has a geometrical configuration selected from a group consisting of circular, elliptic, quadrangular, rhombic and triangular configuration, the cross section meaning the one horizontally extending along the first face or the second face of the middle member main body.

6. The middle member of a heat dissipation device as claimed in claim 2, wherein the cross section of the bosses has a geometrical configuration selected from a group consisting of circular, elliptic, quadrangular, rhombic and triangular configuration, the cross section meaning the one horizontally extending along the first face or the second face of the middle member main body.

7. The middle member of a heat dissipation device as claimed in claim 1, wherein the middle member main body is made of a material selected from a group consisting of pure titanium, titanium alloy, copper, aluminum, stainless steel, ceramic material, aluminum alloy and copper alloy.

8. The middle member of a heat dissipation device as claimed in claim 1, wherein the channeled structure assembly has multiple bosses, the bosses being arranged in an array at spaced intervals, the bosses defining multiple channels therebetween, the middle member main body being defined with a first section, a second section and a third section, two ends of the first section being connected with the second and third sections, the intervals between the bosses of the first section being smaller than the intervals between the bosses of the second and third sections, a diameter of the perforations of the first section being smaller than a diameter of the perforations of the second and third sections, the first section being an evaporation section, while the second and third sections being condensation sections.

9. The middle member of a heat dissipation device as claimed in claim 8, wherein the dimension of the bosses of the first section is smaller than the dimension of the bosses of the second and third sections.

10. The middle member of a heat dissipation device as claimed in claim 1, wherein the channeled structure assembly is disposed on both the first and second faces of the middle member main body.

11. The middle member of a heat dissipation device as claimed in claim 10, wherein the channeled structure assembly is composed of multiple recesses or multiple bosses or multiple recesses and multiple bosses arranged at intervals.

12. The middle member of a heat dissipation device as claimed in claim 1, wherein the perforations have multiple connection passages in a horizontal direction, the connection passages horizontally extending to connect two adjacent perforations, the connection passages being disposed on either the first and second faces or on each of the first and second faces or disposed between the first and second faces of the middle member main body.

13. The middle member of a heat dissipation device as claimed in claim 1, wherein the middle member main body has a support structure, the support structure being disposed on one of the first and second faces or on both the first and second faces.

14. The middle member of a heat dissipation device as claimed in claim 13, wherein the support structure is a solid column body or a hollow collar body, the support structure being made of a material selected from a group consisting of copper, aluminum, iron, stainless steel, ceramic material, commercial pure titanium, titanium alloy, copper alloy and aluminum alloy.

15. The middle member of a heat dissipation device as claimed in claim 13, wherein an outer surface of the support structure is formed with multiple channels, the channels extending in a direction parallel or unparallel to the axial direction of the support structure or intersecting each other or not intersecting each other.

16. The middle member of a heat dissipation device as claimed in claim 13, wherein an outer surface of the support structure is formed with multiple channels, the widths of two ends of the channels being equal to or unequal to each other.

17. The middle member of a heat dissipation device as claimed in claim 14, wherein a porous structure layer formed of sintered powder is disposed on an outer side of the solid column body or the hollow collar body.

18. The middle member of a heat dissipation device as claimed in claim 13, wherein the support structure is a solid column body passing through the first and second faces of the middle member main body.

19. The middle member of a heat dissipation device as claimed in claim 16, wherein the channels have a trapezoidal shape or a conic shape.

20. The middle member of a heat dissipation device as claimed in claim 1, wherein a surface of the channeled structure assembly has a nanometer structure layer, the nanometer structure layer being a nanometer whisker layer or a nanometer carbonized layer or a nanometer oxidization layer, the nanometer oxidization layer being copper oxide, titanium oxide or aluminum oxide.

21. The middle member of a heat dissipation device as claimed in claim 1, wherein at least one mesh body is attached to one face of the channeled structure assembly, the mesh body having multiple meshes, there being multiple mesh bodies, which are overlapped with each other and attached to one face of the channeled structure assembly and integrated with the middle member main body, the sizes of the meshes of the mesh bodies being equal to or unequal to each other.

22. A middle member of a heat dissipation device, comprising a middle member main body, the middle member main body being a multi-piece unit assembly structure, the middle member main body having a substrate and a channeled structure assembly, which are overlapped and assembled with each other having, the substrate having a first face, a second face and multiple perforations, the perforations being formed through the substrate between the first and second faces so as not to intersect the channeled structure, the channeled structure assembly having a capillary structure body and being disposed on one of the first and second faces of the substrate.

23. The middle member of a heat dissipation device as claimed in claim 22, wherein the channeled structure assembly is composed of multiple overlapped layers of mesh bodies, the mesh bodies having multiple meshes, the sizes of the meshes of the mesh bodies being equal to or unequal to each other.

24. A heat dissipation device comprising:
a middle member main body having a first face, a second face, multiple perforations and a channeled structure assembly, the channeled structure assembly being disposed on one of the first and second faces, the perforations being formed through the middle member main body between the first and second faces and located such that they do not intersect the channeled structure, the channeled structure and the perforations being arranged in alignment with each other or not in alignment with each other;
a first plate body having a first surface and a second surface, the first surface of the first plate body having multiple raised sections correspondingly attached to the first face or the second face of the middle member main body, and the second surface formed with multiple depressions in positions opposite to the raised sections; and
a second plate body having a third surface and a fourth surface, the first and third surfaces being correspondingly mated with each other to together define a closed chamber, the middle member main body being disposed in the closed chamber, a working fluid being filled in the closed chamber.

25. The heat dissipation device as claimed in claim 24, wherein the second surface of the first plate body is defined as a condensation face, at least one section of the first surface being defined as a condensation section, the fourth surface of the second plate body being defined as a heat absorption face, at least one section of the third surface being defined as an evaporation section, the condensation section and the evaporation section being up and down correspondingly arranged.

26. The heat dissipation device as claimed in claim 24, wherein the middle member main body and the first and second plate bodies are made of a material selected from a group consisting of pure titanium, titanium alloy, copper, aluminum, stainless steel and ceramic material.

27. The heat dissipation device as claimed in claim 24, wherein a microstructure is disposed on the third surface of the second plate body, the microstructure being a rough face composed of multiple channels or multiple pits and multiple protrusions or a sintered powder layer or a coating layer, the coating layer being a hydrophobic layer or a hydrophilic layer.

28. The heat dissipation device as claimed in claim 24, wherein the channeled structure is disposed on both the first and second faces of the middle member main body.

29. The heat dissipation device as claimed in claim 24, wherein at least one section of the third surface of the second plate body is defined as an evaporation section and either or both of the left end and the right end of the third surface relative to the evaporation section are defined as condensation ends.

30. The heat dissipation device as claimed in claim 24, wherein the surface of the channeled structure has a nanometer structure layer, the nanometer structure layer being a nanometer whisker layer or a nanometer carbonized layer or a nanometer oxidization layer, the nanometer oxidization layer being one of a copper oxide, a titanium oxide or an aluminum oxide.

31. The heat dissipation device as claimed in claim 30, wherein the channeled structure is correspondingly attached to the third surface of the second plate body.

32. The heat dissipation device as claimed in claim 24, wherein the middle member main body has a support structure, the support structure being disposed on one of the first and second faces or both the first and second faces of the middle member main body.

33. The middle member of heat dissipation device as claimed in claim 32, wherein the support structure is a solid column body or a hollow collar body, the support structure being made of a material selected from a group consisting of copper, aluminum, iron, stainless steel, ceramic material, commercial pure titanium, titanium alloy, copper alloy and aluminum alloy.

34. The middle member of heat dissipation device as claimed in claim 32, wherein the support structure is a solid column body passing through the first and second faces of the middle member main body.

35. The middle member of heat dissipation device as claimed in claim 24, wherein the channeled structure assembly of the middle member main body is a mesh body, the mesh body being tightly attached to the middle member main body.

36. The middle member of heat dissipation device as claimed in claim 24, wherein at least one mesh body is attached to one face of the channeled structure assembly, the at least one mesh body being tightly attached to the middle member main body, there being multiple layers of mesh bodies overlapped and assembled with each other.

37. The middle member of heat dissipation device as claimed in claim 36, wherein the mesh bodies have multiple meshes, the sizes of the meshes of the mesh bodies being equal to or unequal to each other.

38. A heat dissipation device comprising:
   a middle member main body, the middle member main body being a one-piece unitary assembly structure, the middle member main body having a substrate and a channeled structure assembly, which are overlapped and assembled with each other, the substrate having a first face, a second face and multiple perforations, the perforations being formed through the substrate between the first and second faces in non-intersecting relation with respect to the channeled structure assembly, the channeled structure assembly having a capillary structure body and being disposed on one of the first and second faces of the substrate;
   a first plate body having a first surface and a second surface; and
   a second plate body having a third surface and a fourth surface, the first and third surfaces being correspondingly mated with each other to together define a closed chamber, the middle member main body being disposed in the closed chamber, a working fluid being filled in the closed chamber.

* * * * *